US009761297B1

United States Patent
Tomishima

(10) Patent No.: US 9,761,297 B1
(45) Date of Patent: Sep. 12, 2017

(54) HIDDEN REFRESH CONTROL IN DYNAMIC RANDOM ACCESS MEMORY

(71) Applicant: Intel Corporation, Santa Clara, CA (US)

(72) Inventor: Shigeki Tomishima, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/396,009

(22) Filed: Dec. 30, 2016

(51) Int. Cl.
| | | |
|---|---|---|
| *G11C 7/00* | (2006.01) |
| *G11C 11/406* | (2006.01) |
| *G11C 11/4093* | (2006.01) |
| *G11C 11/4091* | (2006.01) |
| *G11C 11/4096* | (2006.01) |
| *G11C 11/408* | (2006.01) |
| *G11C 7/10* | (2006.01) |

(52) U.S. Cl.
CPC ...... *G11C 11/40615* (2013.01); *G11C 7/1072* (2013.01); *G11C 11/4087* (2013.01); *G11C 11/4091* (2013.01); *G11C 11/4093* (2013.01); *G11C 11/4096* (2013.01)

(58) Field of Classification Search
CPC ............ G11C 11/406; G11C 11/40615; G11C 11/40611; G11C 11/40607
See application file for complete search history.

(56) References Cited

U.S. PATENT DOCUMENTS

| | | | | |
|---|---|---|---|---|
| 2007/0268768 A1* | 11/2007 | Kawakubo | ............ | G11C 11/406 365/222 |
| 2011/0007593 A1* | 1/2011 | Takano | .................. | G11C 11/406 365/222 |
| 2011/0255360 A1* | 10/2011 | Takahashi | ............. | G11C 11/406 365/219 |
| 2015/0003172 A1* | 1/2015 | Kim | .................. | G11C 11/40607 365/189.05 |
| 2016/0314826 A1 | 10/2016 | Augustine et al. | | |

* cited by examiner

*Primary Examiner* — Tuan T Nguyen
(74) *Attorney, Agent, or Firm* — Jordan IP Law, LLC

(57) ABSTRACT

Systems, apparatuses and methods may provide a way to reduce and or eliminate contention between refresh operations and read/write operations, and a larger page buffer for read/write operations for dynamic random access memory (DRAM) technology. More particularly, systems, apparatuses and methods may provide a way to improve a DRAM to perform read/write operations with section selection. Systems, apparatuses and methods may provide for including additional transfer gates in a DRAM to provide section selection to reduce and or eliminate contention between refresh operations and read/write operations, and a larger page buffer for read/write operations.

25 Claims, 16 Drawing Sheets

US 9,761,297 B1

HIDDEN REFRESH CONTROL IN DYNAMIC RANDOM ACCESS MEMORY

TECHNICAL FIELD

Embodiments generally relate to dynamic random access memory (DRAM) technology. More particularly, embodiments relate to a way to reduce and/or eliminate contention between refresh operations and read/write operations, and provide a larger page buffer for read/write operations using section selection.

BACKGROUND

Dynamic random access memory (DRAM) cell size shrinkage may continue to occur due to improvements in process technology. Additionally, CPU (central processing unit) performance improvements may result in lower power consumption requirements, data bandwidth (BW) demands and capacity demands. DRAM cell refresh time requirements may also be getting shorter, while cell sizes continue to reduce in size. Accordingly, maintaining cell capacitance may be more difficult and cell leakage may increase due to a smaller two dimensional (2D) footprint. For example, larger DRAM capacities may demand an increase in the frequency at which the cells need to be refreshed to maintain the data stored in the cells, requiring more refresh time to maintain cell data for DRAMs, which may increase the potential for contention between refresh operations and read/write operations. As a result, performance degradations may occur.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
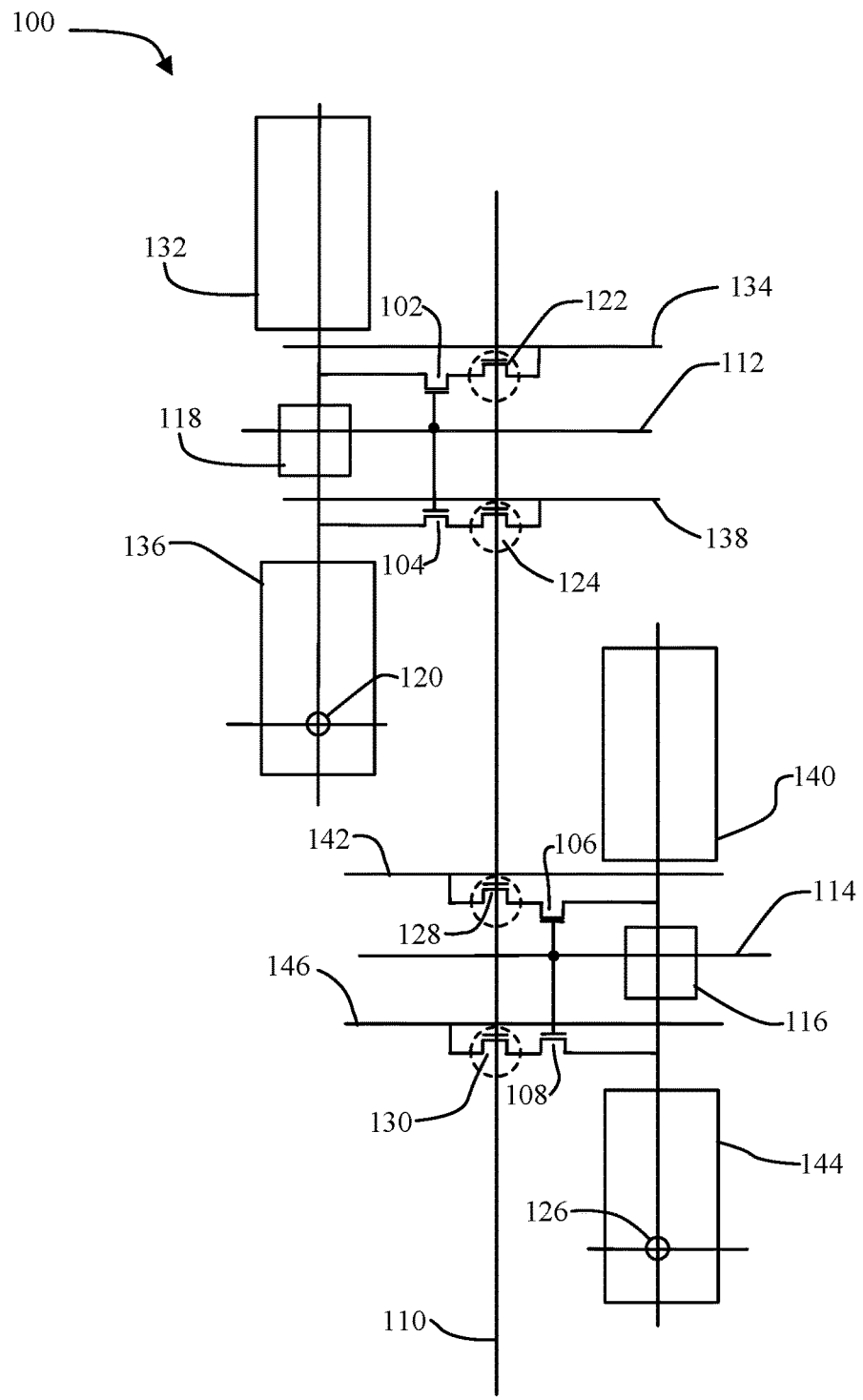
FIG. 1 is a schematic diagram of an example dynamic random access memory (DRAM) memory bank circuit with one or more additional transfer gates according to an embodiment.

In particular embodiments, a memory module with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org). Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Due to a demand for larger memory capacity in servers, PCs (personal computers), laptops, and handheld devices, volatile memory, including DRAM, die sizes may be increasing. For example, in 30 nanometer (nm) process technology a 4 gigabyte (Gb) DRAM die was common. In 20 nm process technology, however, capacity increased to 8 Gb DRAM. In future technology, (e.g., the 10 nm range), 12 Gb DRAM or 16 Gb DRAM capacities may be realized. An increase in DRAM capacity may increase the number of word lines (WL) to be refreshed. Accordingly, the refresh operation may be issued more frequently in order to refresh an increasing number of WLs, while attempting to avoid degrading DRAM performance (e.g., due to delays in data access operations, power consumption).

Conventional DRAM technology, however, separates row access operations (e.g., ACT command a.k.a. activate command/operation, traditional READ and WRITE operations) from refresh operations (e.g. traditional all-bank refresh operations, traditional explicit per-bank refresh operations), which may cause timing conflicts between refresh operations and traditional row access operations. Conventional DRAMs may also be fabricated to generate two or multiple row addresses for refresh operation from one input at a time, wherein the two address sets inputs include an external row address for traditional ACT operations and an internally generated internal refresh address for the refresh operation. DRAMs fabricated with advanced process technologies may have reduced/shortened retention times from 64 milliseconds (ms) to 32 ms, which may require a 7.8 microsecond (μs) (8K/64 ms) refresh operation to be reduced to 3.9 μs. Consequently, traditional READ operations and WRITE operations may be suspended and/or blocked by a traditional refresh operation more frequently, causing performance degradation and peak power consumption. As will be discussed in greater detail, hidden refresh operations may be used to eliminate performance degradations and reduce peak power consumption.

FIG. 1 is an illustration of an example dynamic random access memory (DRAM) memory bank circuit 100 with additional transfer gates 102, 104, 106, 108 according to an embodiment. Although FIG. 1 illustrates an example DRAM memory bank circuit 100, the implementation described herein, may be applied more generally to any type of volatile memory. The one or more additional transfer gates 102, 104, 106, 108 may be used during section selection to control the transfer of sense amplifier data between one or more memory cells of a DRAM. The additional transfer gates 102, 104, 106, 108 may be configured to open and close based on one or more section selection bits received by the DRAM. Opening and closing the additional transfer gates 102, 104, 106, 108 based on one or more section selection bits limits or eliminates one or more impacts (e.g., data conflicts from different sense amplifiers/SAs) that may result from activating a column select line (CSL) 110 (e.g., column signal line), and/or protect and/or maintain SA stability. For example, as a result of a DRAM column operation the additional transfer gates 102, 104, 106, 108 opened may be based on the CSL 110 and one or more section selection bits. One or more section selection signals 112, 114 (e.g., "Section Select 0," "Section Select 1") at the transfer gates 102, 104, 106, 108 may be set to a logical '1' (e.g., set ON, high, 'H') to activate/open the transfer gates.

The illustrated CSL 110, which is common to transfer gates along CSL 110, may be activated. The added transfer gates 106, 108 may be set to a logical '0' (e.g., set OFF, low, 'L') at the hidden refresh sections 114, so that there may be no influence or impact on the sense amplifier (SA) 116 of the DRAM. A WL (e.g., WL0) 120 (e.g., for a main section selection) may open a memory cell access transistor (not shown) and deliver a cell charge to bit line (BL) pair BL 132 and /BL 136 for SA 118 to sense and amplify. Transfer gates 102, 104 may be set ON so that SA 118 may sense and amplify. BL 132 and /BL 136 at SA 118 may connect to local input-output (LIO0) pairs 134 and 138 through serial transfer gates 102 and 122, and 104 and 124, and column operations may be performed. SA 116 may sense and amplify BL 140 and /BL 144 through serial transfer gates 106 and 128, and 108 and 130 to select one or more sections 114.

In one example, the section selection signals 112, 114 may default to "H" (e.g., selected, set to a logical '1', set ON, high 'H'), and one or more of the section selection signals 112, 114 may be set to "L" (e.g., set to a logical '0', set OFF, low 'L') for the selected sections to protect from READ/WRITE operations or off when section selection occurs for the hidden refresh performed by the hidden per-bank refresh command.

In another example, the section selection signals 112, 114 may default to "L" (e.g., unselected, disabled), and one or more of the section selection signals 112, 114 may be set to "H" (e.g., selected, activated) to open for main section selection (e.g., WL 0) 120.

Figure 14:
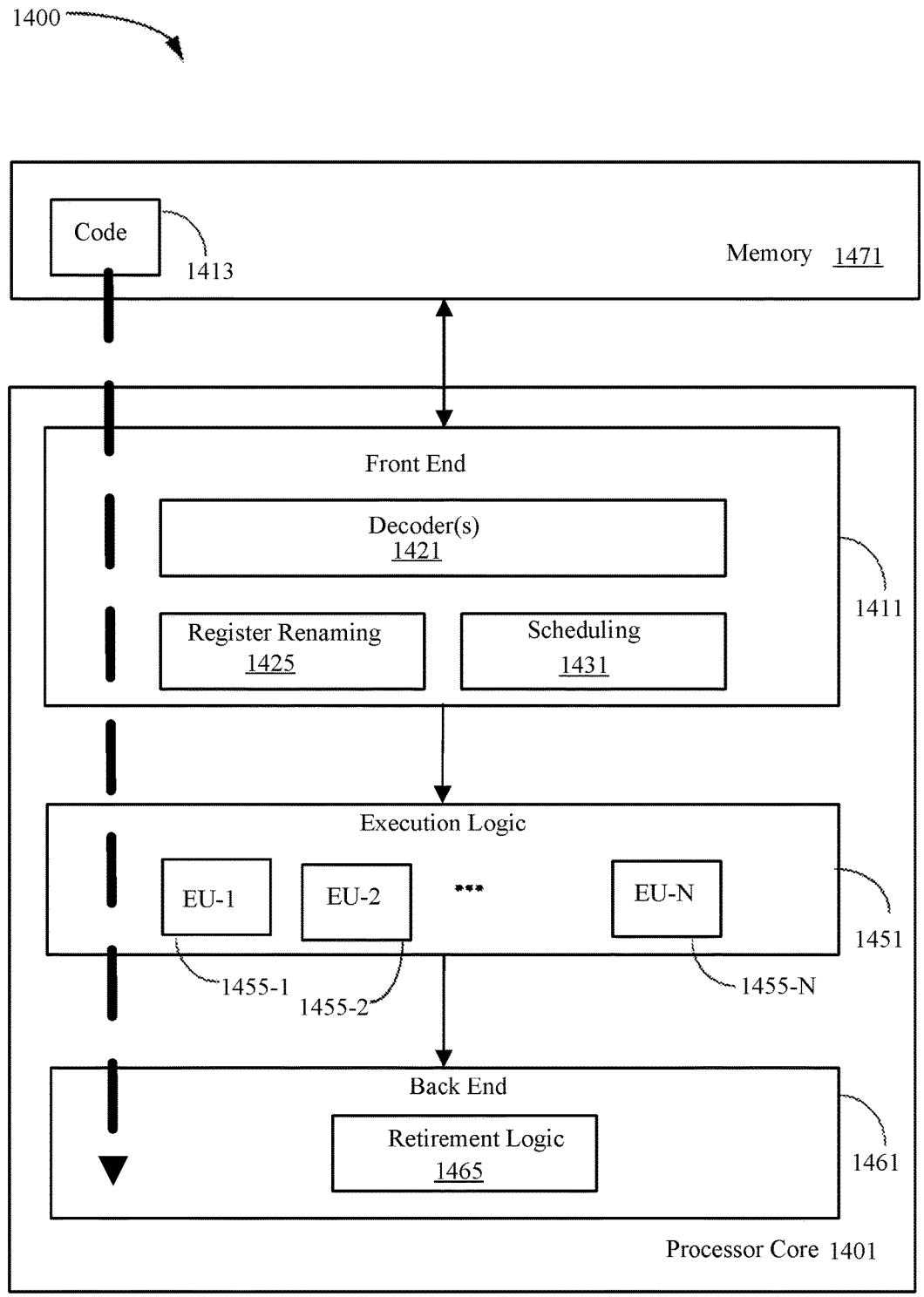
FIG. 14 is a block diagram of an example of a processor according to an embodiment.
Figure 15:
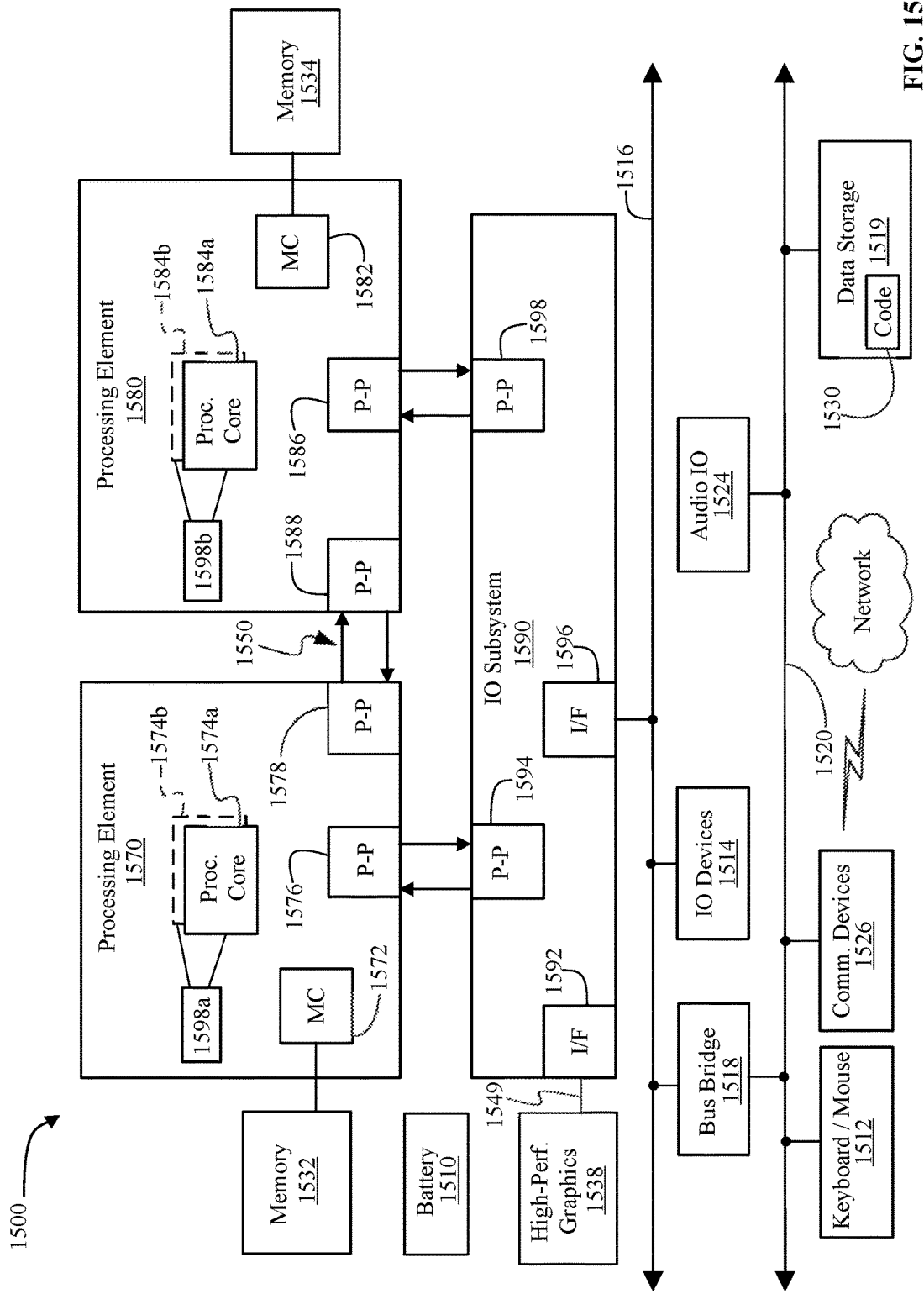
FIG. 15 is a block diagram of an example of a computing system according to an embodiment.

Implementing the additional transfer gates 102, 104, 106, 108 may enable section selection signal variations to be used to implement new operations and/or one or more combination of operations. The one or more additional transfer gates 102, 104, 106, 108 may be an N-type metal-oxide-semiconductor (nMOS) transistor or some other suitable type of transistor technology. The DRAM memory bank circuit 100 with additional transfer gates 102, 104, 106, 108 for section selection may be implemented in a DRAM system, as illustrated in FIGS. 14 and 15, discussed below, to provide faster computing and graphics, lower power consumption and longer battery life.

In another example, in order to select section '0', bit line (BL) 132 and /BL 136, section selection signal 112 may be maintained high (e.g., default) to activate/open transfer gates 102, 122 between BL 132 and local input-output (LIO0) 134, and transfer gates 104, 124 between /BL 136 and /LIO0 138. Section selection signal 112 may be set low to deactivate/close transfer gates 102, 104, 122, 124 when section '0' is selected, for example, for traditional operations (e.g., ACT). Section selection signal 114 may be maintained low to deactivate/close transfer gates 106, 128 between BL 140 and LIO1 142, and transfer gates 108, 130 between /BL 144 and LIO1 146. The section selection signal 114 may be set high to activate/open transfer gates 106, 128 between BL 140 and LIO1 142, and transfer gates 108, 130 between /BL 144 and LIO1 146, when section '1' is selected for column operations (e.g., read/write). Managing when the additional transfer gates 102, 104, 106, 108 may be opened or closed, using section selection bits, may reduce and/or eliminate contention between refresh operations and read/write operations, and provide a larger page buffer for read/write operations using section selection, as describe below.

Figure 2:
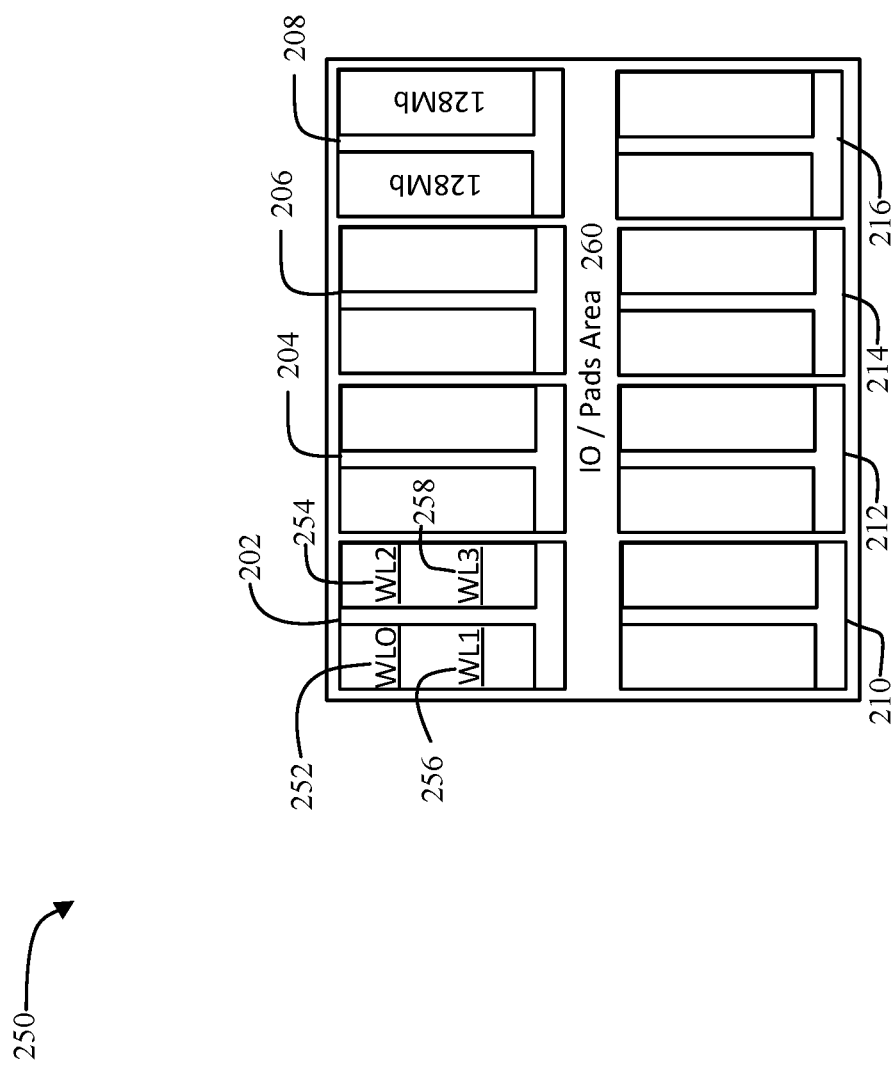
FIG. 2 is a block diagram of an example of a DRAM with hidden refresh according to an embodiment.

FIG. 2 illustrates a block diagram 250 of an example DRAM with hidden refresh (e.g., hidden per-bank auto-refresh). FIG. 2 illustrates an example DRAM 2Gb×4 with 8 banks 202, 204, 206, 208, 210, 212, 214, 216 (e.g., banks 0, 1, 2, 3, 4, 5, 6, 7), with 32K of addressable row addresses, 2K of addressable column addresses, 8 Kb page size, and 32-bit prefect. Each bank may further include multiple word lines, for example, bank 202 which includes WLs (WL0, 1, 2 and 3) 252, 254, 256, 258, and the DRAM may further include one or more input-output pad areas 260 for communications. Using the external address of a bank, received from a memory controller (MC), one or more WL, for example, WL0 252 may be activated for read/write, and, by ignoring the section selection address bits, activate one or more word lines WLs (WL1, 2 and 3) 254, 256, 258 for refresh. In order to activate the one or more WLs, based on the process of row address decoding, one or more section selection bits may be ignored (e.g., for a hidden refresh). A DRAM implemented, as exampled, with section selection provides a way to activate multiple WLs, for example, WL (WL0) 252 may be activated for read or write while WLs (WL1, 2 and 3) 254, 256, 258 in Bank 0 (B0) 202 may be activated for refresh simultaneously. The DRAM with hidden refresh may use the external row address received from the memory controller (MC) and row decoders to activate (e.g., calculate an internal refresh address for) the additional WLs (WL1, 2 and 3) 254, 256, 258, and the cell data may be latched at the associated sense amplifier (SA), so that the cells on WLs (WL1, 2 and 3) 254, 256, 258 may also be refreshed to perform a more efficient version (e.g., power consumption, performance) of a traditional explicit per-bank refresh operation.

The DRAM with hidden refresh (e.g., hidden per-bank auto-refresh) may activate additional pages (e.g., an ACTA command may activate one or more targeted WLs for read and/or write operations and perform hidden refresh operation for non-targeted WLs of a memory bank) as a larger page buffer for traditional read operations and write operations, when the hidden refresh is issued with section selection bits that specify one or more WLs (e.g., memory cells) in one or more memory banks to access. The MC may access activated additional pages as a larger page buffer for more burst operations, as a result of one or more ACTA commands to activate one or more WLs of a bank activated for hidden refresh operations (e.g., per-bank address refresh), using the external address and ignoring the section selection address bits.

For example, when an ACTA command is issued to activate one or more WLs for hidden refresh operation, the column operation read and write may receive the section address with a CAS command (column address command bit) and the column address. The read command and write command (e.g., operations) may be issued with a section address to select one or more activated sections of a bank, and simultaneously with the column address, perform read operations and/or write operations. A hybrid read command and/or write command with hidden refresh may be respectively identified by the "READA" command and "WRITEA" command to differentiate from the traditional "READ" and "WRITE" commands. The "READA" command and "WRITEA" command with the additional section address may perform CAS operations using larger page sizes, as already discussed, provided by the hidden refresh (e.g., hidden per-bank auto-refresh).

In contrast to the example DRAM with hidden refresh (e.g., hidden per-bank auto-refresh) as illustrated above in FIG. 2, a traditional DRAM under traditional bank ACT operations (e.g., activate one or more memory cells for read/write operations), using the external address, WL (WL0) may be selected and activated in bank 0 (B0), while WLs (WL1, 2 and 3) in bank 0 (B0) may not be activated. Traditional ACT operations may use the external address to identify the WL (e.g., main section selection) to activate, while a traditional all bank refresh may use the internal address to activate WLs (WL0, 1, 2 and 3) for refresh. Using traditional DRAM architectures, a memory controller may not track which memory cells have been refreshed, and ACT operations (e.g., activate one or more memory cells for read/write operations) and refresh operations operate separately, independent of each other so that ACT operations and refresh operations may be executed in one or more sequences, once a previously issued operation has completed. Traditional read/write operations may follow the refresh operation. When a word line is activated by a traditional ACT operation then the memory controller may issue one or more subsequent refresh operations to the same activated WL.

For example, a traditional all bank refresh operation for a DRAM (e.g., 8Gb DDR3) may take an amount of time (e.g., 300 nanosecond (ns), referred to as dead time) to complete before a next operation or activation may be issued. During a traditional refresh operation, peak power consumption may occur to perform the operation. The dead time may result from an all bank refresh operation to activate the word lines for all the banks of a DRAM, before memory controller may issue another operation (e.g., read/write operation) to the DRAM. A traditional per bank refresh operation may specify a bank and word line to activate within less than 1/8 of the dead time (e.g., less than ⅛ of 300 ns) the time to perform an all bank refresh (e.g., 300 ns dead time), potential for contention between refresh operations and read/write operations, which may result in performance degradations. In contrast to traditional DRAM architectures, a DRAM with hidden refresh (e.g., hidden per-bank auto-refresh, section selection) may reduce and/or eliminate contention between refresh operations and read/write operations, and provide a larger page buffer for read/write operations using section selection.

Figure 3:
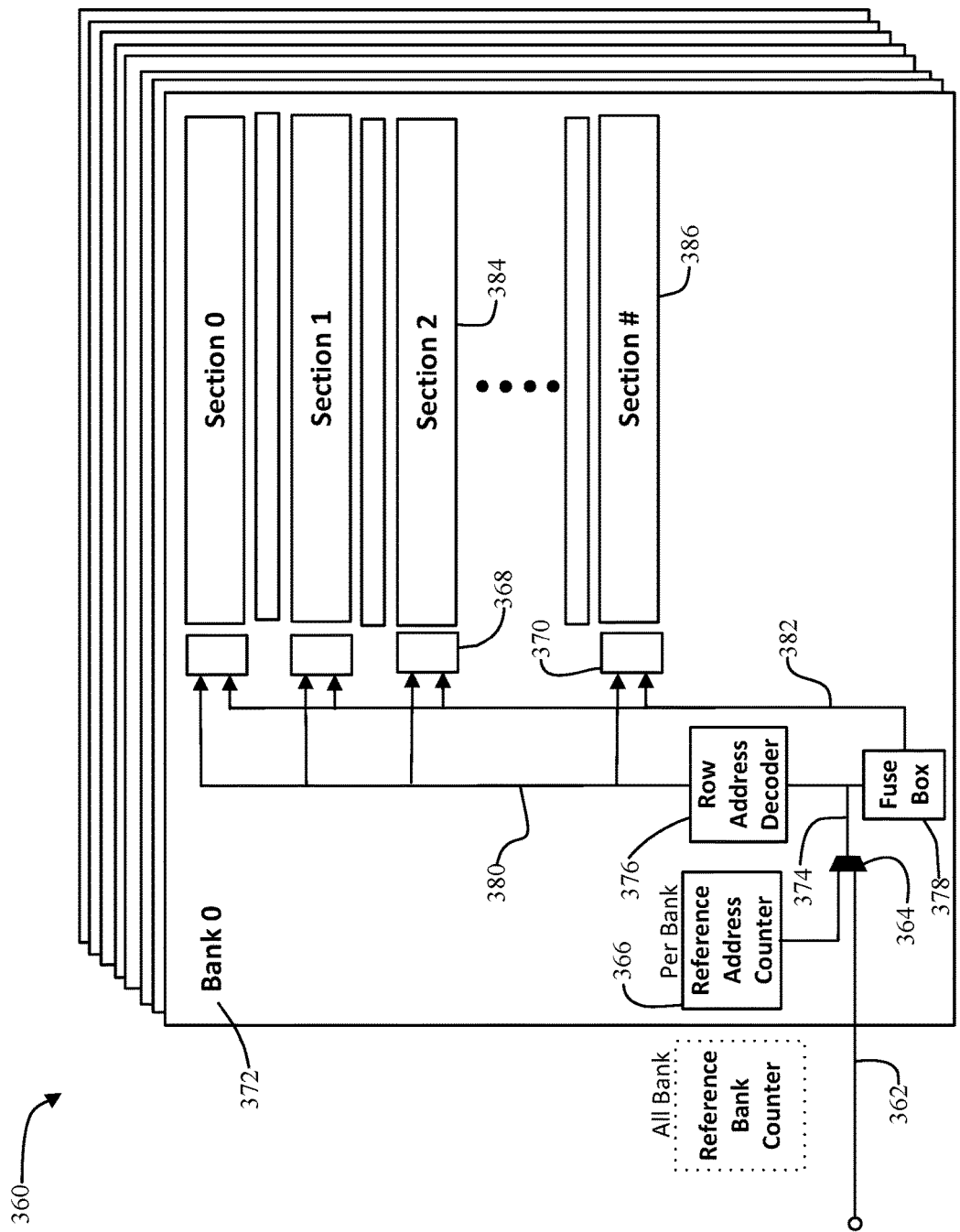
FIG. 3 is a block diagram of an example of a DRAM according to an embodiment.

FIG. 3 is a block diagram 360 of example of a DRAM according to an embodiment. A memory controller, not shown, may be connected to a DRAM at a row address pin 362 that includes a max gate 364. An internal bank address counter 366 may also be connected to the max gate 364. The memory controller may supply an external row address at the row address pin 362 (e.g., that specifies a word line WL 368, 370 of a memory bank, bank 0 372) to the DRAM without tracking which one or more word lines are refreshed and/or specified by the row address. The output (e.g., signal) 374 of the max gate 364 may be feed to a row address decoder 376 and fuse box 378 (e.g., with logic to blow fuses for redundant row selection). When the memory controller issues a refresh operation, the max gate 364 may output (e.g., signal) 374, which the refresh address counter 366 may use to provide the internal bank refresh address at 380. The fuse box 378 may provide output at 382 indicating redundant row selection. For refresh operations, for section selections 384, 386 with hidden refresh, for example, the external row address (e.g., used by the DRAM internally, as described in FIGS. 6A and 6B below) may be used to calculate the address of one or more non-targeted word lines to refresh.

Figure 4A:
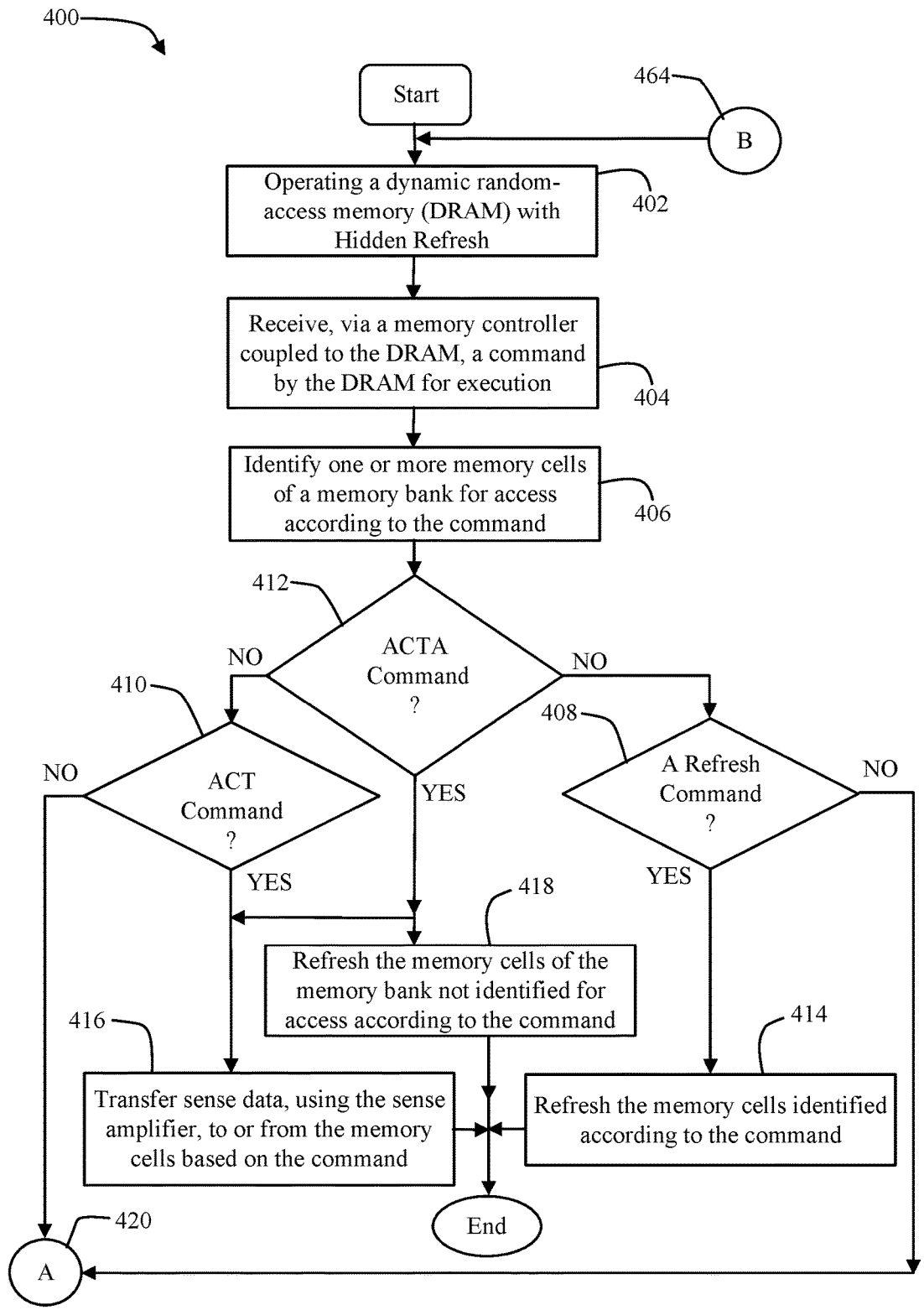
FIG. 4A is a flowchart of an example of a method of processing a command issued to a DRAM with hidden refresh according to an embodiment.

FIG. 4A shows an example of a method 400 of processing a command issued to a DRAM with hidden refresh according to an embodiment. The method 400 may be implemented as a module or related component in a set of logic instructions stored in a non-transitory machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof. For example, computer program code to carry out operations shown in the method 400 may be written in any combination of one or more programming languages, including an object oriented programming language such as JAVA, SMALLTALK, C++ or the like and conventional procedural programming languages, such as the "C" programming language or similar programming languages.

Illustrated processing block 402 provides for operating a dynamic random access memory (DRAM) comprising managing a DRAM comprising a memory bank comprising a plurality of memory cells, and a plurality of sense amplifiers associated with one or more of the memory cells to transfer sense amplifier data. Illustrated processing block 404 provides for receiving, via a memory controller communicatively coupled to the DRAM, one or more commands for the DRAM to execute, and transferring sense data, using the sense amplifiers, between the one or more of the memory cells based on the one or more commands. Illustrated processing block 406 provides for identifying each of the memory cells by a row address identifying a word line identifying a bit line value pair, the bit line value pair including a first bit line value and a second bit line value, and calculating, using a refresh address counter, each address of the word lines of the memory bank based on the row address. The targeted word lines are to be identified by the row address received by the DRAM to perform one or more memory operations on the one or more targeted word lines. The non-targeted word lines identify word lines not identified for access by the one or more memory operations. One or more of the word lines of the memory cells may be identified, using a section selection signal, and each of the sense amplifiers is to be activated or deactivated by the section selection signal via the first transfer gate and the second transfer gate. The transfer gates may be NMOS transfer gates, as previously discussed in FIG. 1. The column address of one or more of the memory cells may be identified, using a column select line (CSL) (e.g., column signal line). A third transfer gate and a fourth transfer gate may connect a first local input-output signal to the first bit line value and a second local input-output signal to the second bit line value, respectively. The third transfer gate may be connected in series between the first transfer gate and the first local input-output signal. The fourth transfer gate may be connected in series between the second transfer gate and the second local input-output signal, and the third transfer gate and the fourth transfer gate may be activated or deactivated by the column signal line based on the column address.

The commands may include one or more of a traditional read command, a traditional write command, a traditional explicit per-bank refresh command or a hidden per-bank refresh command, wherein the read command is to perform a read operation and the write command is to perform a write operation, and wherein the explicit per-bank refresh command refreshes the word lines of the memory bank in an amount of time identified as refresh cycle time. The explicit per-bank refresh command may need to be explicitly called to refresh a memory bank, in contrast to the hidden per-bank refresh command, which may activate one or more memory cells for a subsequently executed read or write operation and simultaneously refresh non-targeted memory cells.

Illustrated processing block 408 provides for determining whether the issued command is a traditional refresh command (e.g., a traditional explicit per-bank refresh command). Illustrated processing block 410 provides for determining whether the issued command is a traditional ACT command (e.g., a.k.a. activate command). Illustrated processing block 412 provides for determining whether the issued command is an ACTA command (e.g., activate one or more memory cells for a subsequently executed read or write operation, and refresh non-targeted memory cells for refresh with the hidden per-bank auto-refresh). Illustrated processing block 414 provides for performing a refresh of the memory cells (e.g., multiple word lines) identified according to the command. Illustrated processing block 416 provides for transferring sense data, using the sense amplifier, to or from the memory cells single (e.g., word line).

Illustrated processing block 418 provides for a hidden per-bank refresh command to cause one or more targeted word lines to be activated for one or more read operations or write operations to be subsequently executed, and simultaneously cause a hidden refresh operation to use the external address for ACT commands to provide the address (e.g., the external address is used by the DRAM internally, as described in FIGS. 6A and 6B below) of the one or more non-targeted word lines to refresh. The hidden per-bank refresh command may be issued once per memory bank to activate the one or more targeted word lines for one or more read operations or write operations to be subsequently executed following completion of the hidden per-bank refresh, and to perform the hidden refresh operation for the one or more non-targeted word lines to provide processing time savings to issue one or more additional read commands, write commands or hidden per-bank refresh commands. The hidden per-bank refresh command may be issued, as an alternative to issuing the explicit per-bank refresh command in sequence with the read command or the write command. When a traditional explicit per-bank refresh command is issued, the hidden per-bank refresh command, the read command and the write command may not be executed until after the traditional explicit per-bank refresh command refresh completes. The processing time savings that may result, using/issuing the hidden per-bank refresh command to replace the traditional explicit per-bank refresh command, may be at least equal to the refresh cycle time for the traditional explicit per-bank refresh command.

Figure 4B:
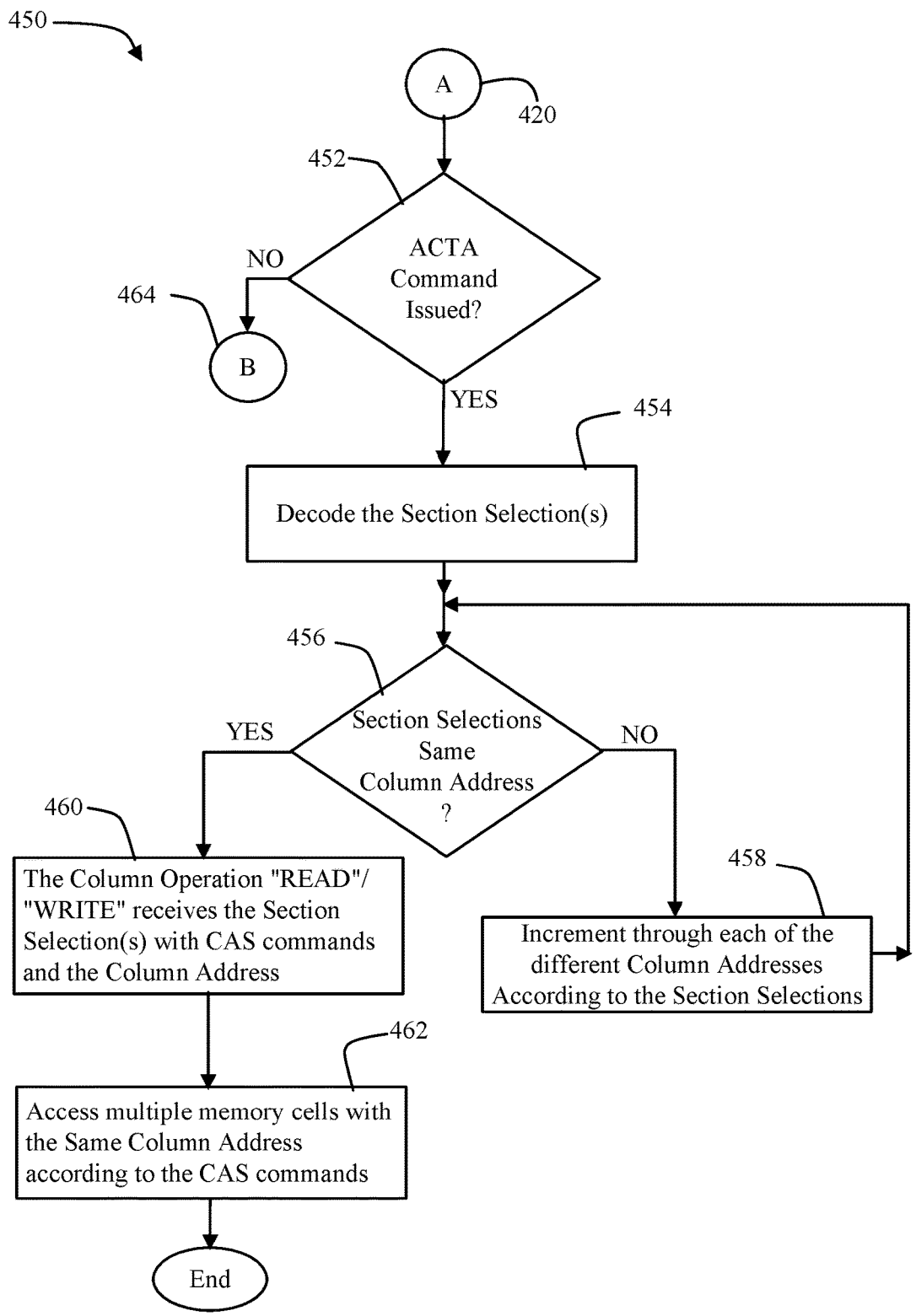
FIG. 4B is a flowchart of an example of a method of processing a command issued to a DRAM with section selection according to an embodiment.

Turning now to FIG. 4B, an example is illustrated of a method 450 of processing a command issued to a DRAM with section selection according to an embodiment. The method 450 may be implemented as a module or related component in a set of logic instructions stored in a non-transitory machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 452 provides for determining whether the received command is an ACTA command to activate one or more memory cells for a read operation or write operation with hidden per-bank refresh. Illustrated processing block 454 provides for decoding the section selection(s), when the received command is determined to be an ACTA command.

Illustrated processing block 456 provides for determining one or more of the section selection(s) refer to a common column address. Illustrated processing block 458 provides for increment through each of the different column addresses according to the section selections. Illustrated processing block 460 provides for the column operation "READ"/ "WRITE" (e.g., fixed-functionality hardware logic) receiving the section selection(s) with CAS commands and the column address. Illustrated processing block 462 provides for accessing one or more memory cells simultaneously with a common column address according to the received command (e.g., CAS command).

Figure 5:
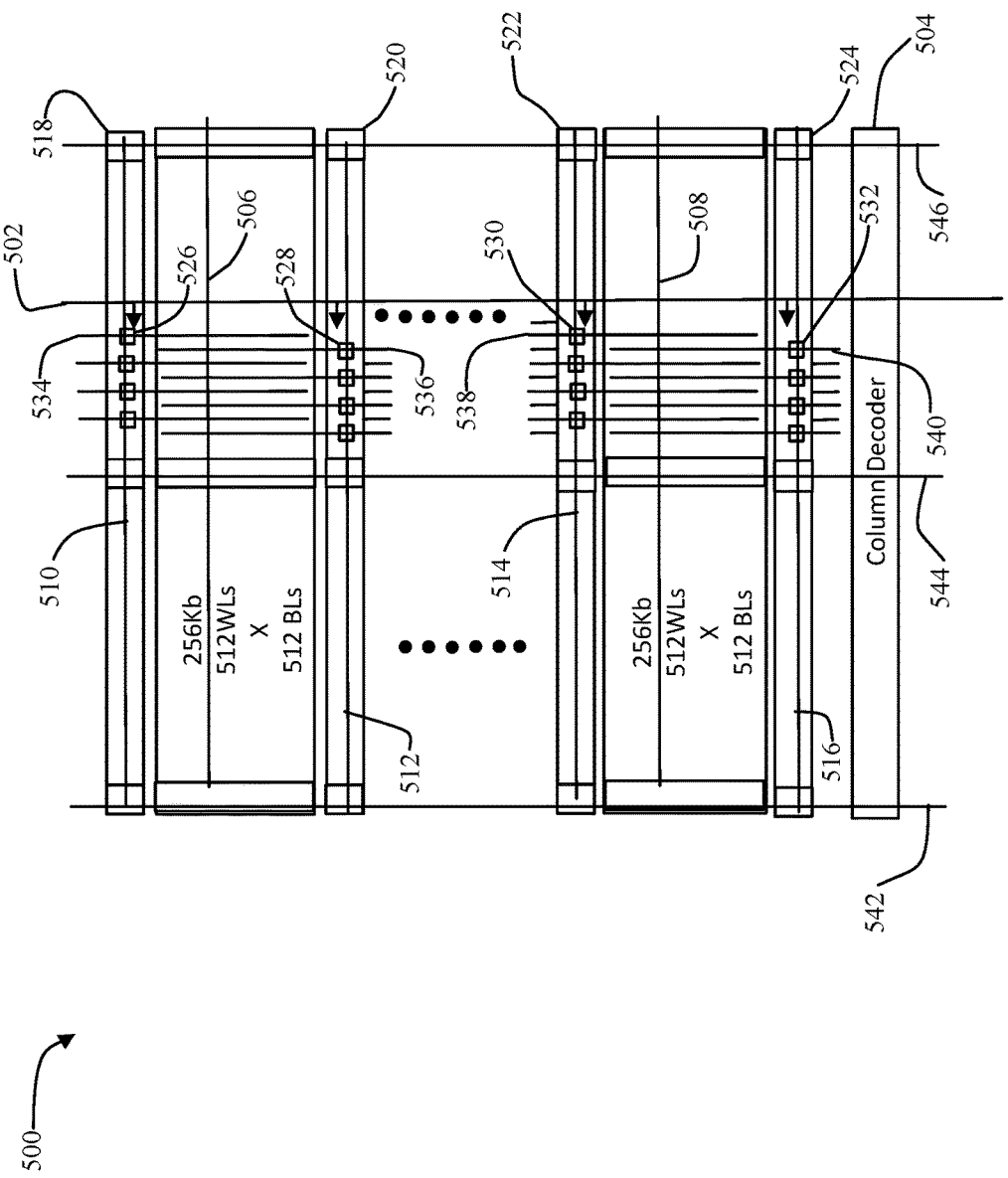
FIG. 5 is a block diagram of an example of local amplifier (LA) control to prevent data conflicts according to an embodiment.

FIG. 5 is a block diagram 500 of an example of local amplifier (LA) control to prevent data conflicts according to an embodiment. The column select line 502 out of decoder 504 may activate the connection between sense amplifiers and local input-output (LIO) at WL0 506 and WL1 508. At each section selection signal of each WL, sense amplifiers transfer sense amplifier data via local input-put (LIO) 510, 512, 514, 516 to local amplifiers (LAs) 518, 520, 522, 524 that may be connected between sense amplifiers 526, 528, 530, 532 and the BL and /BL 534, 536, 538, 540 of the memory cells. The local amplifiers (LAs) 518, 520 may operate to connect or block global input-output communication (e.g., CSL—column select line) 502 to control transfer of sense amplifier data to/from WLs (e.g., WL 0, 1) 506, 508. In order to prevent one or more data conflicts on global input-output lines (GIO) 542, 544, 546, local amplifiers (LAs) 518, 520 may be activated at WL0 section selection 506 (e.g., main section select), while at other sections (e.g., hidden refresh section selection) for WL1 508, and WL2 and WL3 not shown, the LAs 522, 524 may be disabled simultaneously.

For example, a memory controller, communicatively coupled to a DRAM with section selection (e.g., read operations and/or write operations with hidden-refresh), may issue one or more commands to the DRAM for execution. Sense amplifiers 526, 528, 530, 532 may transfer sense data to or from one or more of the memory cells based on the one or more commands. Each of the memory cells may be identified by a row address identifying a word line (e.g., WL 0, 1) 506, 508 and a column address identifying bit line value pairs 534, 536 (e.g., BL and /BL value pairs), for example, a first bit line value and a second bit line value. Each of the sense amplifiers 526, 528 may be connected in series to LA 518 (e.g., a first transfer gate) between the first bit line value 534, and LA 520 (e.g., a second transfer gate) between the second bit line value 536, respectively. The memory bank may further include a refresh address counter to calculate each address of the word lines of the memory bank based on the row address.

One or more targeted word lines may be identified by the row address received by the DRAM to perform one or more memory operations on the one or more targeted word lines. The non-targeted word lines may be word lines not identified for access by the one or more memory operations (e.g. read operations and/or write operations). The hidden refresh operation may use the external address (e.g., used by the DRAM internally, as described in FIGS. 6A and 6B below) to calculate the address of one or more non-targeted word lines to refresh.

The memory bank may include a section selection signal to identify one or more of the word lines WL0 506 and WL1 508 of the memory cells. Each connection between of the sense amplifiers 526, 528, 530, 532 and LIO lines 510, 512, 514, 516 may be activated or deactivated by the section selection signal via the first transfer gate 518 and the second transfer gate 520. The memory bank may further include a column select line 502 to identify the column address of one or more of the memory cells, a third transfer gate and a fourth transfer gate to connect a first local input-output signal and a second local input-output signal to the first bit line value and the second bit line value, respectively. The third transfer gate 522 may be connected in series between sense amplifier 530 and the first local input-output signal 514 to bit line value 538. The fourth transfer gate 524 may be connected in series between sense amplifier 532 and the second local input-output 516 signal to bit line value 540. The third transfer gate and the fourth transfer gate may be activated or deactivated by the column select line 502 based on the column address. The one or more commands may include a read command, a write command, an explicit per-bank refresh command or an ACTA command to activate one or more WLs for hidden refresh (e.g., hidden per-bank refresh). The read command and the write command may perform a read operation and a write operation, respectively. The explicit per-bank refresh command may refresh the word lines of the memory bank in an amount of time identified as refresh cycle time.

The ACTA command to activate one or more WLs for hidden refresh (e.g., hidden per-bank refresh) may cause the one or more targeted word lines to be activated for a read operation or write operation to be subsequently executed, and simultaneously cause the hidden refresh operation to use the external address (e.g., used by the DRAM internally, as described in FIGS. 6A and 6B below) to calculate the address of one or more non-targeted word lines to refresh. The ACTA command may be issued once per memory bank to activate one or more WLs for the read operation or the write operation to be subsequently executed for the one or more targeted word lines and to perform the hidden refresh operation for the one or more non-targeted word lines to provide processing time savings to issue one or more additional read commands, write commands or hidden refresh (e.g., hidden per-bank refresh) commands. The ACTA command to activate one or more WLs for hidden refresh (e.g., hidden per-bank refresh) may be issued, as an alternative to issuing the explicit per-bank refresh command in sequence with the read command or the write command. When or if the explicit per-bank refresh command (e.g., traditional) is issued, the ACTA command to activate one or more WLs for hidden refresh (e.g., hidden per-bank refresh), the read command and the write command may not be executed until after the explicit per-bank refresh command (e.g., traditional) refresh completes. The processing time savings resulting from using the hidden per-bank refresh is at least equal to the refresh cycle time for the explicit per-bank refresh command.

Figure 6B:
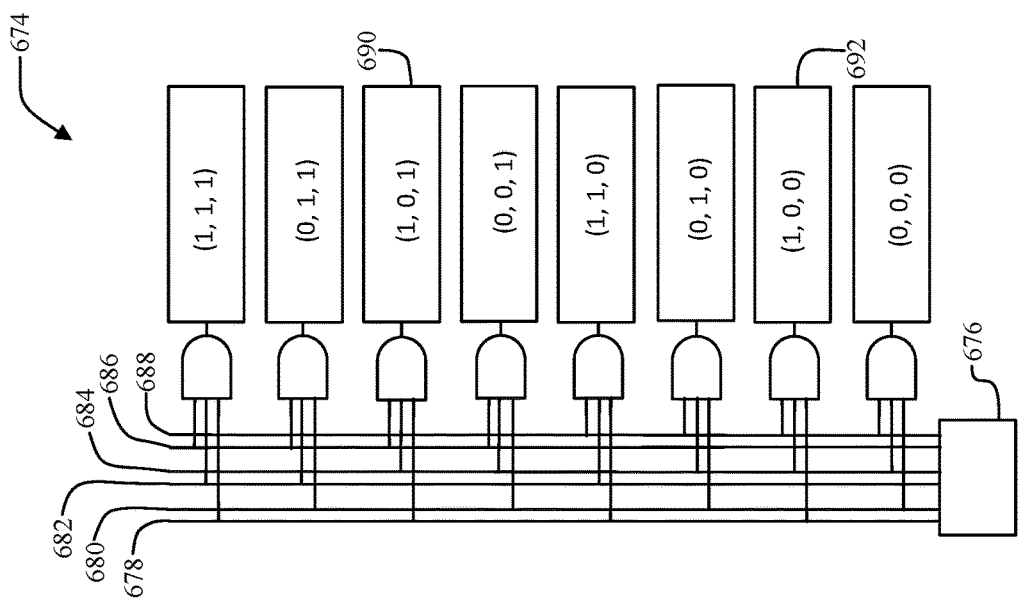
FIGS. 6A and 6B are schematic diagrams of examples of circuits to generate a section selection signal to select multiple sections according to an embodiment.
Figure 6A:
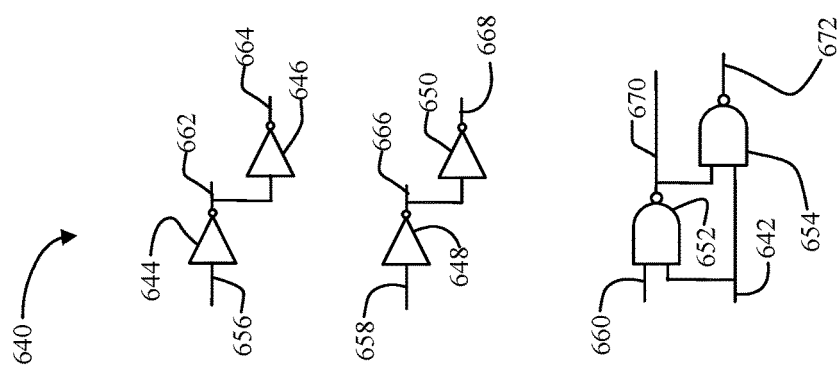

FIG. 6A is a block diagram 640 of example of a circuit to generate a section selection signal to select multiple sections according to an embodiment. An ACTA signal 642 (e.g., read/write operation with hidden refresh) may be maintained low until being set high. The ACTA signal 642 may be input to one or more circuit gates 644, 646, 648, 650, 652, 654 (e.g., AND gate, NAND gate, inverter, etc.) for each WL of the bank identified by the row address (e.g., row address bits 656, 658, 660). In one example, when an ACTA operation is received, the ACTA signal 642 may be set low, and, after receiving a row address (e.g., row address bits 656, 658, 660), multiple WLs may be selected as a result of the circuit gates 644, 646, 648, 650, 652, 654 and identified by the signals 662, 664, 666, 668, 670, 672.

FIG. 6B is a block diagram 674 of example of a circuit to generate a section selection signal to select multiple sections according to an embodiment. The output of one or more circuit gates 676, may include signals 678, 680, 682, 684, 686, 688 (e.g., as illustrated in FIG. 6A as signals 662, 664, 666, 668, 670, 672), based on the row address, as also illustrated in FIG. 6A, may be used to select one or more sections 690, 692.

Figures 7A, 7B:
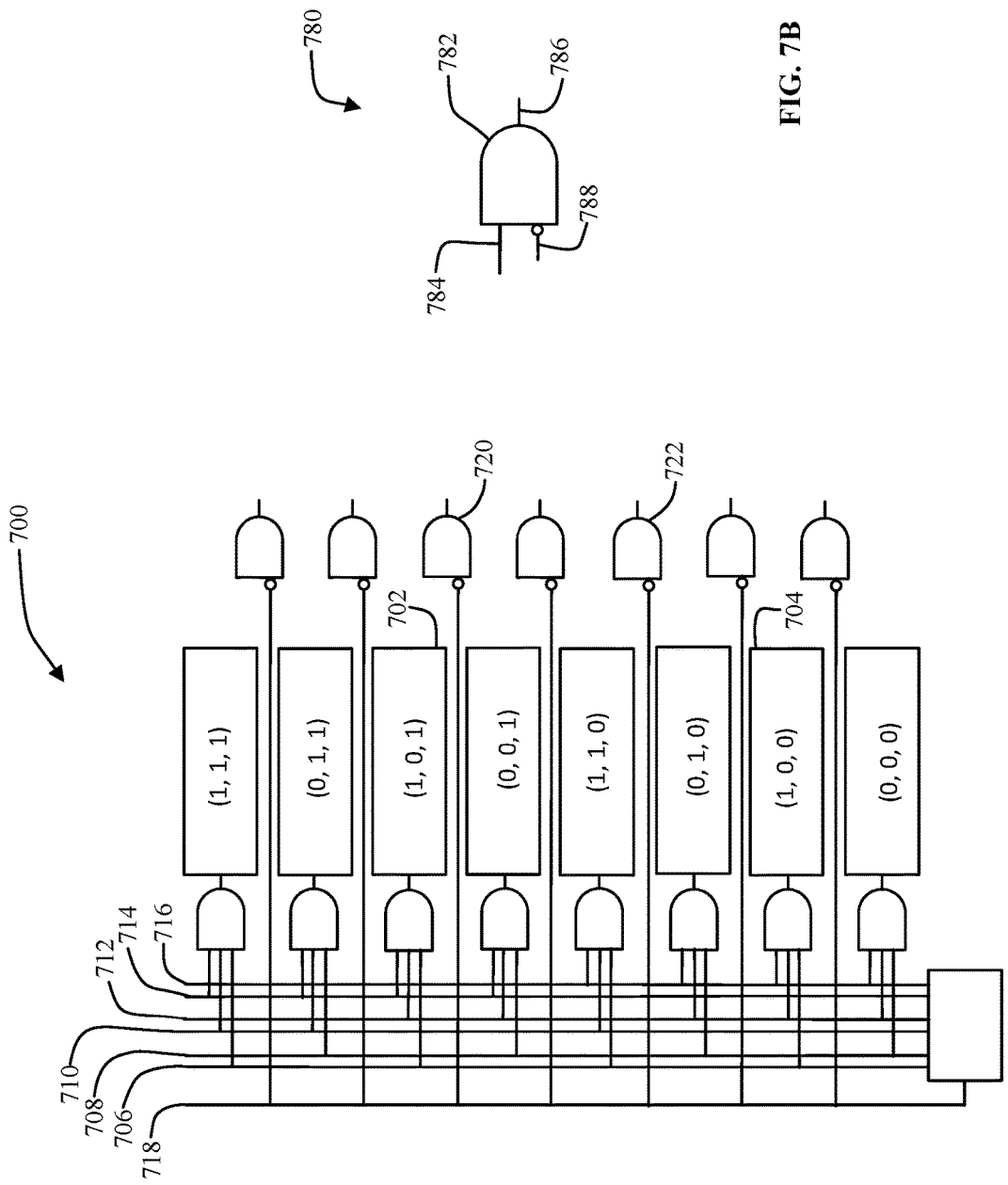
FIGS. 7A and 7B are schematic diagrams of examples of circuits to generate a section selection signal to select multiple sections according to one or more embodiments.

FIGS. 7A and 7B are schematic diagrams 700 and 780 of examples of circuits to generate a section selection signal to select multiple sections according to one or more embodiments. FIG. 7A illustrates one or more circuit gates (e.g., AND gate, NAND gate, inverter, etc.) arranged to select one or more sections 702, 704 from section selection bits (e.g., 3 bits to identify 8 row addresses) (e.g., signals 706, 708, 710, 712, 714, 716) based on one or more section selection bits 718, producing one or more section selection at 720, 722. FIG. 7B illustrates schematic diagram 780 of an example circuit gate 782, illustrated in FIG. 7A at 720, 722, configured to receive a section selection signal 784 (e.g., section enable signal) and set a section selection signal high 786 (e.g., active) when a section selection bit 788 (e.g., illustrated in FIG. 7A as 718) signal is low, and when the section selection bit 788 is high the section selection signal 786 may be set low (e.g., deactivated).

Figure 8:
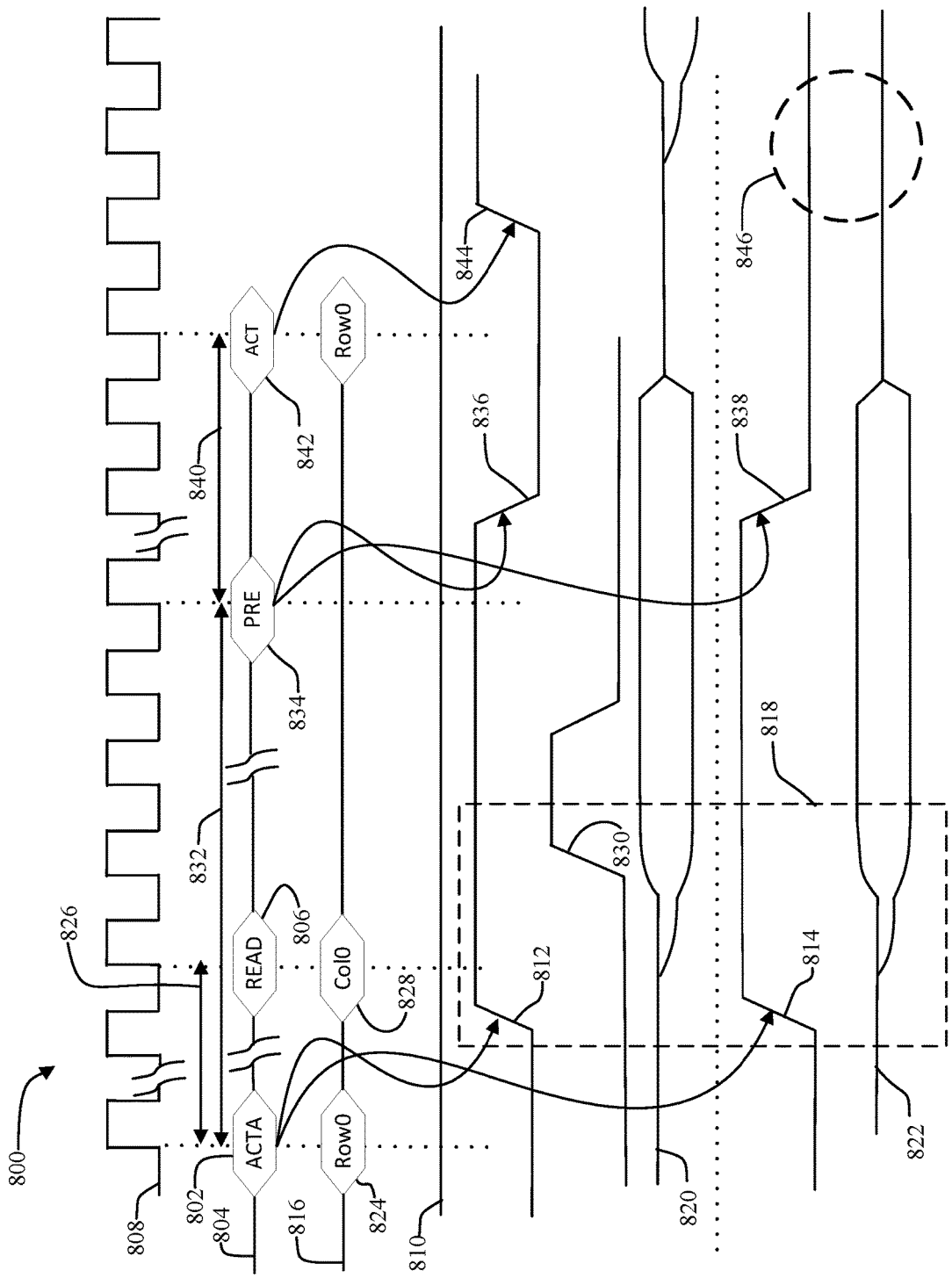
FIG. 8 is a timing diagram of an example of a read operation following a hidden refresh according to an embodiment.

FIG. 8 is a timing diagram 800 of an example of a read operation following a hidden refresh, e.g., an ACTA operation 802, received at 804 (e.g., command signal), followed by a read operation 806 and/or other operations, such as a write operation with hidden-refresh (e.g., hidden per-bank auto-refresh), according to an embodiment. As illustrated in FIG. 8, a timing signal 808 and data lines signal 810 are shown, according to which one or more WLs (e.g., sections) may be activated WL0 812, and/or WLs (e.g., WL 1, 2, and 3) 814 based on the external row address 816. In order to activate one or more WLs, section selection bit information may be ignored. For example, after an "ACTA" command 802, WLs (e.g., WL 0, 1, 2, and 3) may be activated simultaneously 818 and the cell data latched at the SA of each WLs (e.g., WL 0, 1, 2, and 3) in one or more sections 820 (e.g., BL pair on WL 0) and/or 822 (e.g., BL pairs on WL 1, 2, and 3).

The main row for activation (e.g., activated at 812) (e.g., WL 0 in section 0) may be specified by the external row address 816 at row operation 824. The additional WLs (e.g., WL1, 2, and 3) (e.g., activated at 814) in one or more sections may be selected by ignoring the section selection bit information for hidden refresh operations. After a row address (RAS) to column address (CAS) delay (tRCD) time 826, the memory controller (MC), not shown, may issue a traditional "READ" command 806 or "WRITE" command, and the column operation 828 may occur at a section based on the external address 816, activating the column select line (CSL) 830. At least at or shortly after row active time (tRAS) 832, a pre-charge operation 834 may be performed that deactivates WLs for the bank (e.g., WL 0, 1, 2, 3) (e.g., deactivated at 836, 838), where tRAS 832 is the minimum number of cycles that a row may be active to ensure enough time to access information, which may be greater than or equal to the sum of one or more latencies. After precharging 834, the WLs and sections, at least at or shortly after row pre-charge time (tRP) 840, for example after issuing the pre-charge command 834, when the MC issues a traditional "ACT" command 842 (e.g., for a read operation and/or write operation), the main section selection (e.g., WL0) may be activated 844, while additional WL1, 2 and 3 and sections may not be activated 846.

Figure 9:
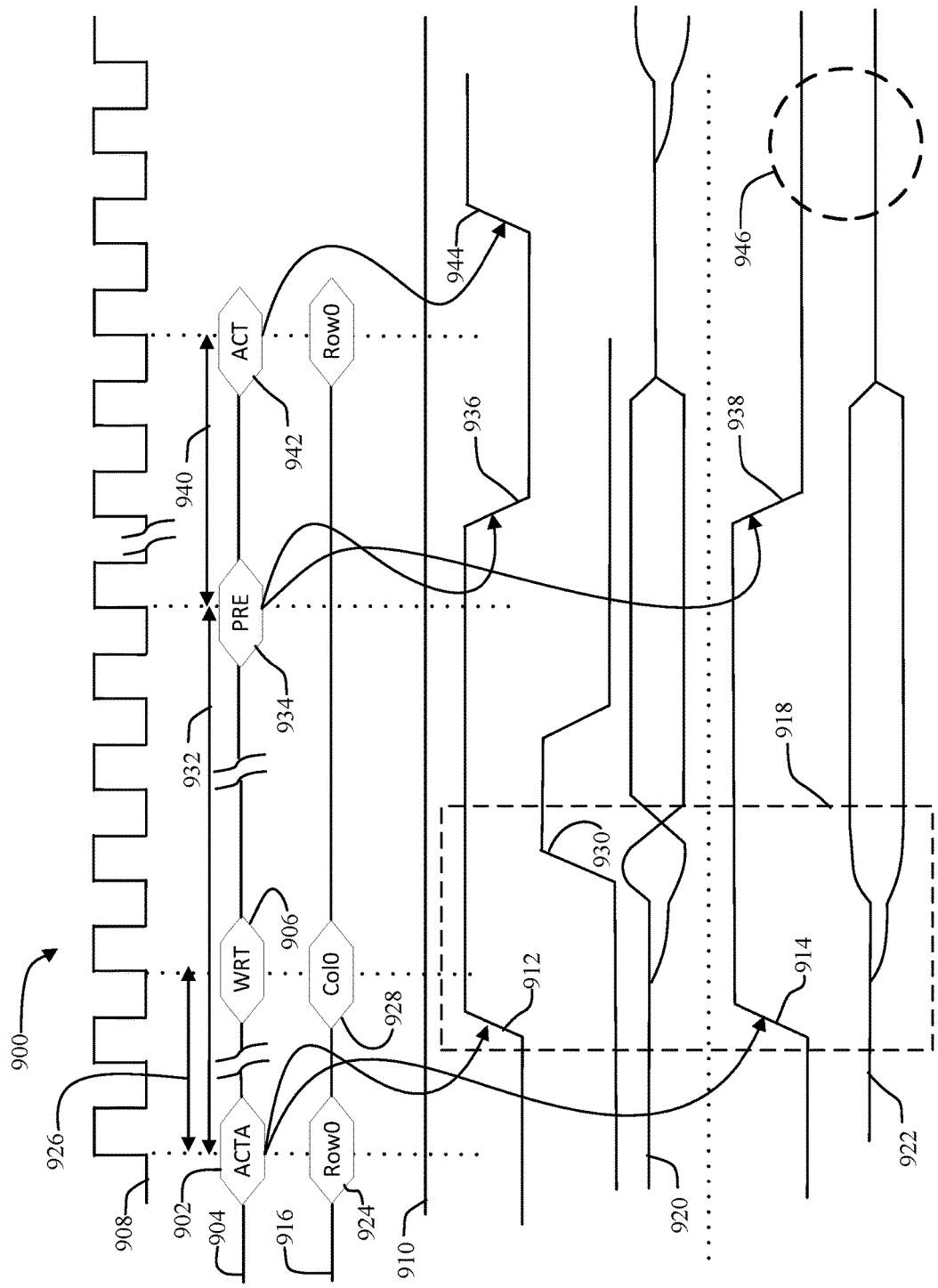
FIG. 9 is a timing diagram of an example of a write operation following a hidden refresh according to an embodiment.

FIG. 9 is a timing diagram 900 of an example of a write operation following a hidden refresh, e.g., an ACTA operation 902, received at 904 (e.g., command signal), followed by a write operation 906 and/or other operations, according to an embodiment. Comparing the read operation with hidden refresh timing, as previously discussed at FIG. 8, the write operation with hidden refresh timing may be similar. As illustrated in FIG. 9, a timing signal 908 and data lines signal 910 are shown, according to which one or more WLs (e.g., sections) may be activated WL0 912, WLs (e.g., WL 1, 2, and 3) 914 based on the external row address 916. In order to activate one or more WLs, section selection bit information may be ignored. For example, after an "ACTA" command 902, WLs (e.g., WL 0, 1, 2, and 3) may be activate simultaneously 918 and the cell data latched at the SA of each WLs (e.g., WL 0, 1, 2, and 3) in one or more sections 920 (e.g., BL pair on WL 0) and/or 922 (e.g., BL pairs on WL 1, 2, and 3).

The main row for activation (e.g., activated at 912) (e.g., WL 0 in section 0) may be specified by the external row address 916 at row operation 924. The additional WLs (e.g., WL1, 2, and 3) (e.g., activated at 914) in one or more sections may be selected by ignoring the section selection bit information for hidden refresh operations. After a row address (RAS) to column address (CAS) delay (tRCD) time 926, the MC may issue a traditional "WRITE" command 906 or "READ" command, and the column operation 928 may occur at a section based on the external address 916, activating the column select line (CSL) 930. At least at or shortly after row active time (tRAS) 932, a pre-charge operation 934 may be performed that deactivates WLs for the bank (e.g., WL 0, 1, 2, 3), where tRAS 932 is the minimum number of cycles that a row may be active to ensure enough time to access information, which may be greater than or equal to the sum of one or more latencies. After precharging 934, the WLs and sections, at least at or shortly after row pre-charge time (tRP) 940, for example after issuing the pre-charge command 934, when the MC issues a traditional "ACT" command 942 (e.g., for a read operation and/or write operation), the main section selection (e.g., WL0) may be activated 944, while additional WL1, 2 and 3 and sections may not be activated 946.

Figure 10:
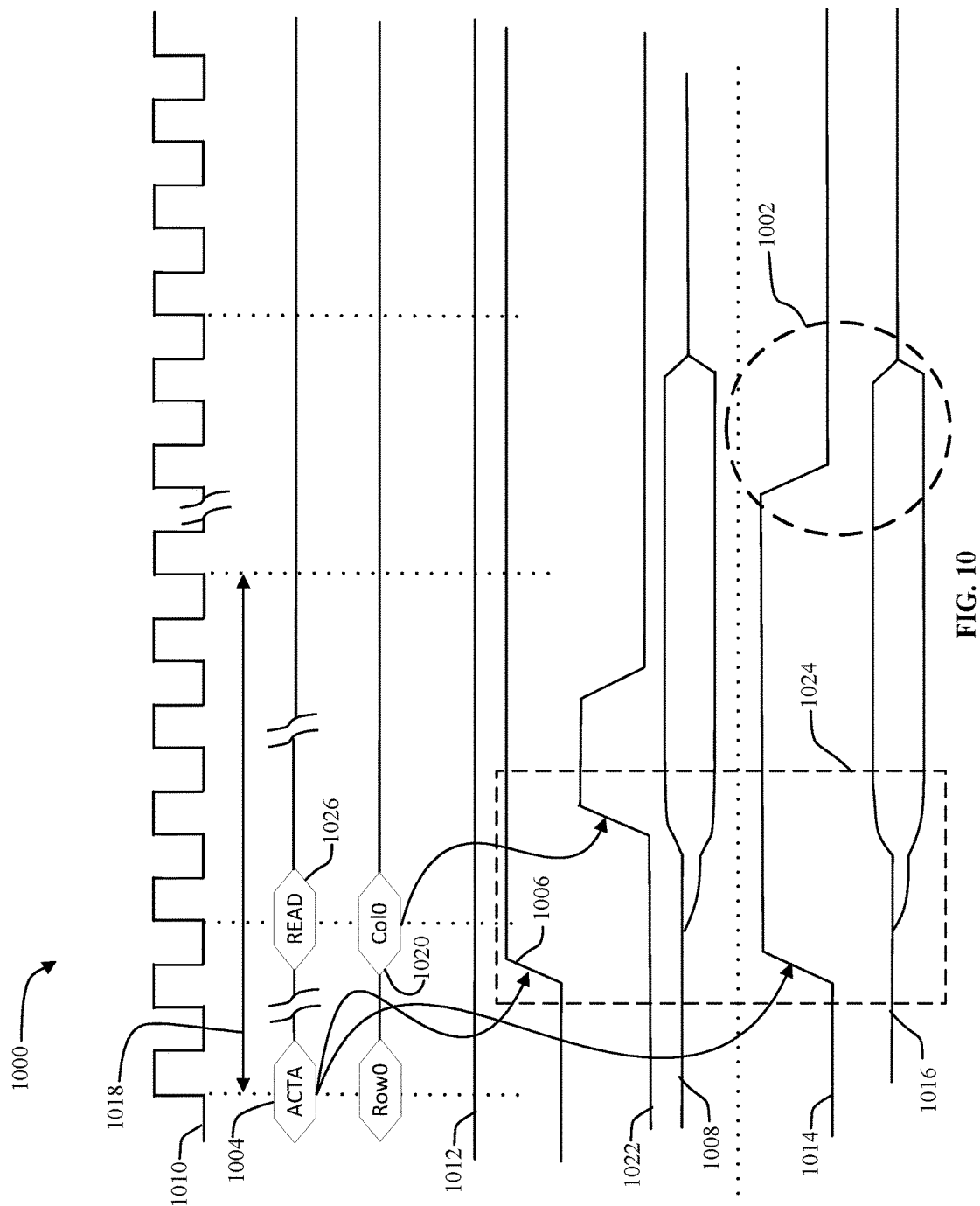
FIG. 10 is a timing diagram of an example of a read/write operation following a hidden refresh with automatic closure according to an embodiment.

FIG. 10 is a timing diagram 1000 of example of a read and/or write operation following a hidden refresh with automatic closure 1002 according to an embodiment. Following an ACTA command 1004 (e.g., activate for read operations and/or write operations with section selection) main WL and section continue (e.g., WL0 1006, section 0, BL pair on WL0 1008) may be open until a "PRE" command is issued. As illustrated in FIG. 10, a timing signal 1010 and data lines signal 1012 are shown, according to which WLs and sections (e.g., WL1, 2, 3 and associated sections) 1014, 1016 for hidden refresh may be closed and terminated automatically internally within a configurable time period (e.g., the regular Auto-Refresh). When no pre-charge operation is executed, following an ACTA command 1004, WL0 1006 may continue to be activated for read/write operations 1026, e.g., for at least or following tRAS maximum timing specifications 1018. Following a column operation 1020, the column select line (CSL) 1022 may be activated. And, for a configurable time period at least at or shortly after WL1, 2, 3 are refreshed at 1024, WL1, 2, 3 and associated sections 1014, 1016 may be automatically deactivated (closed) at 1002, while WL0 activation 1006 may be dynamically activated and maintained for a specified time (e.g., based on the time of the last page hit, read/write). And, at least at or shortly after WL1, 2, 3 are refreshed at 1024, one or more of the WL1, 2, 3 and associated sections 1014, 1016, may be activated then at another specified time closed at 1002 at the sense amplifiers and placed in stand by state, for example, based on one or more performance or power consumption factors and/or requirements.

Figure 11:
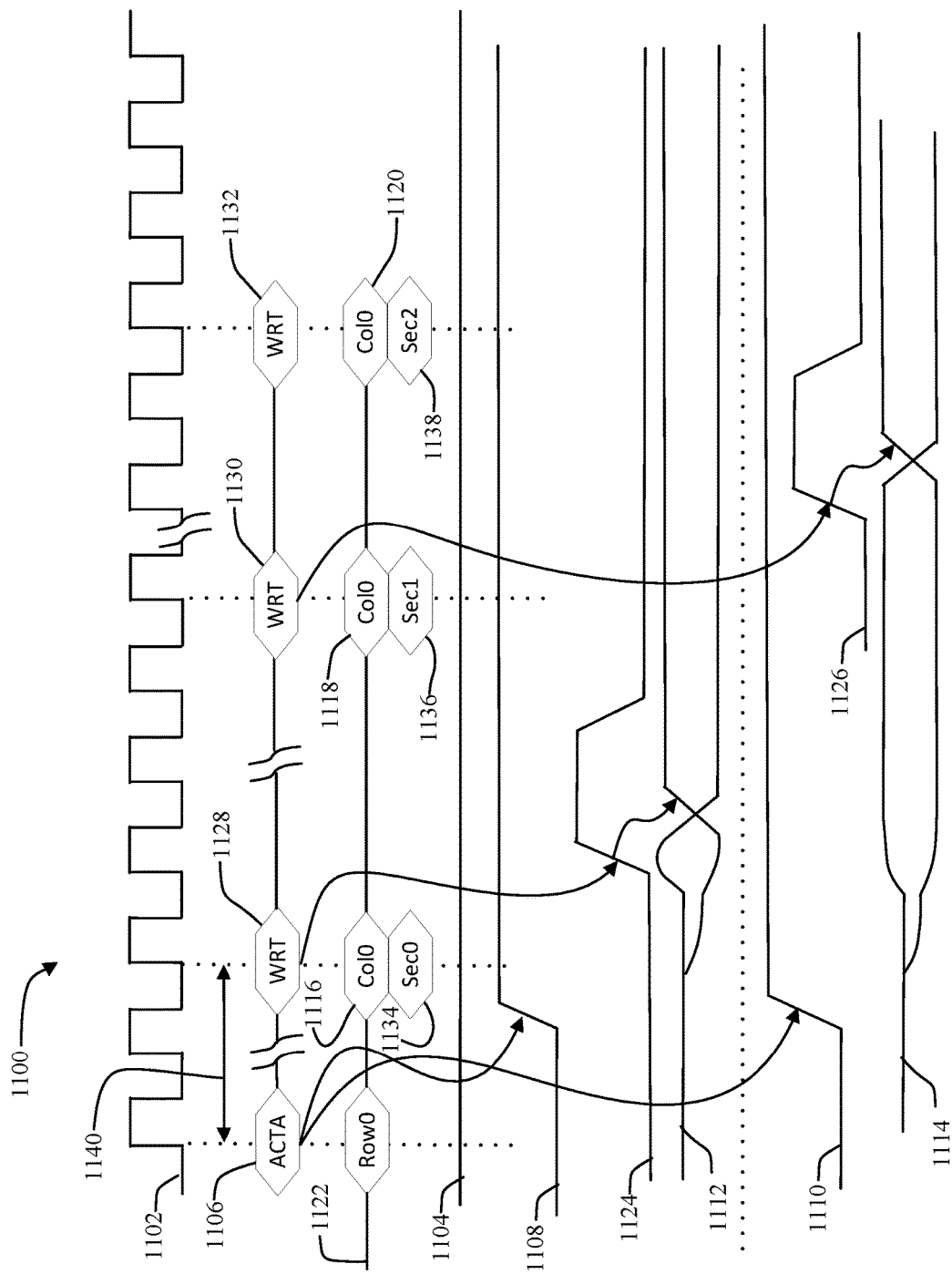
FIG. 11 is a timing diagram of an example of the use of activated additional pages for "hidden refresh" as a larger page buffer for "read" and "write" operations according to an embodiment.

FIG. 11 is a block diagram of example of a timing diagram 1100 for using activated additional pages for "hidden refresh" as a larger page buffer for "read" and "write" operations according to an embodiment. As illustrated in FIG. 11, a timing signal 1102 and data lines signal 1104 are shown, according to which when an ACTA command 1106 is issued with section selection, one or more WLs (e.g., WL0, 1, 2, 3) 1108, 1110 and one or more sections (e.g., BL pair on WL0 or BL pairs on WL1, 2, 3) 1112, 1114 may be activated, and subsequent read operations and/or write operations may be performed on one or more WLs (e.g., WL0, 1, 2, 3) with a common column address (e.g., operation) 1116, 1118, 1120. By activating and maintaining the WLs (e.g., WL0, 1, 2, 3) 1108, 1110 and sections 1112, 1114 open for column operations 1116, 1118, 1120 at a section based on the external address 1122, activating column select lines (CSL) 1124, 1126 for respective sections, a subsequent "READ" and/or "WRITE" command 1128, 1130, 1132 (e.g., a "READA" command, and/or a "WRITEA" command) may issue with a section address to select one or more activated sections (e.g., activated by a previous ACTA command 1106). After an ACTA command 1106 is issued, the column operation "READ" and/or "WRITE" 1128, 1130, 1132 may receive the section address 1134, 1136, 1138 with CAS commands and the column address to perform a "READ" operation and/or "WRITE" operation 1128, 1130, 1132 at one or more WLs (e.g., WL0, 1, 2, 3) 1108, 1110 and sections 1112, 1114, after a row address (RAS) to column address (CAS) delay (tRCD) time 1140. CAS commands (e.g., READ/WRITE commands) may be issued with section selection bits 1136, 1138 specified without specifying the column address, when the column address is common to the previous operation 1128, 1130.

Figure 12:
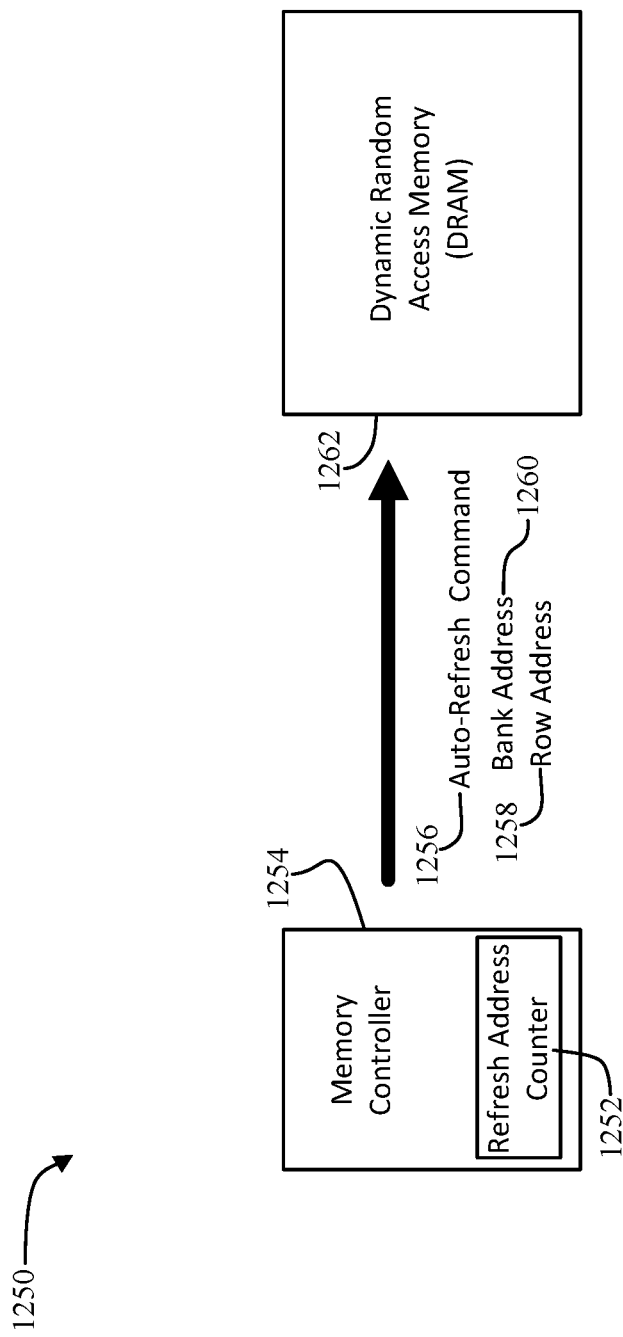
FIG. 12 is a block diagram of example of a smart memory controller (MC) platform according to an embodiment.

FIG. 12 is a block diagram 1250 of example of a smart memory controller (MC) platform according to an embodiment. A refresh address counter 1252 or an accessed row address detector may be located in the smart MC 1254 to generate and track which row addresses have been accessed and/or refreshed. The smart MC 1254 may manage tracking the refreshed address and the accessed address with dynamically programmable logic and/or fixed-functionality hardware logic (e.g., learning and/or modeling) to determine which and when to refresh one or more memory cells (e.g., WLs WL 0 thru WL n). The smart MC 1254 may send the refresh command 1256 (e.g., auto-refresh command) and row address 1258, and for an explicit per-bank refresh, specify and manage the bank address 1260, so that the DRAM chip 1262 may operate directly to access and/or refresh memory cells without generating the row address internally in order to perform access and/or refresh operations, which may reduce the number of times the smart MC 1254 may issue one or more refresh commands to a DRAM. The time saved by the smart MC 1254, including a counter to generate the row addresses of the memory banks (e.g., address for WL 0 of n WLs of a memory bank) and functionality to track which addresses have been refreshed, one or more additional operations may be performed by the DRAM.

In contrast to the smart MC, as illustrated in FIG. 12 above, a traditional memory controller platform may include a refresh address counter located in a DRAM chip that may generate the row address internally for each WL, and the traditional MC may send a refresh command, and for an explicit per-bank refresh operation, specify and manage a bank address. For example, for a traditional MC platform all bank auto-refresh operation, where the traditional MC may not track which WLs (e.g., WL 0 thru WL n) are activated, the traditional MC may send the auto-refresh command to the DRAM for each WL of a DRAM.

Figure 13:
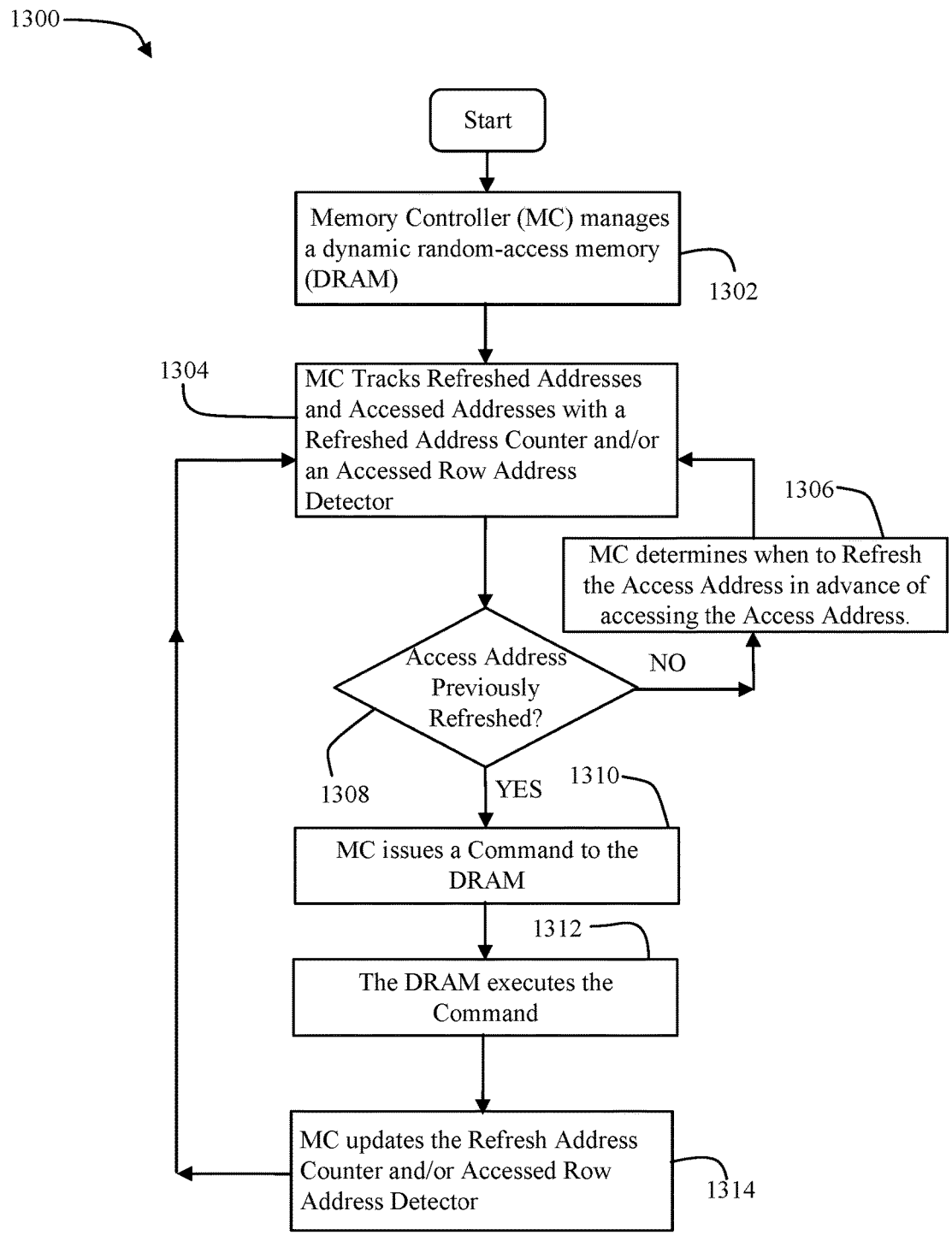
FIG. 13 is a flowchart of an example of a method of a smart MC (Memory Controller) platform according to an embodiment.

Turning now to FIG. 13, an example is illustrated of a method 1300 of a smart controller according to an embodiment. The method 1300 may be implemented as a module or related component in a set of logic instructions stored in a non-transitory machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 1302 provides for managing the memory controller (MC) may a dynamic random access memory (DRAM) implemented with a refresh address counter or an access detector may be located in the MC (e.g., a smart MC). Illustrated processing block 1304 provides for generating and tracking which row addresses have been accessed and/or refreshed with the refresh address counter and/or the accessed row address detector with fixed-functionality hardware logic (e.g., learning and/or modeling). Illustrated processing block 1306 provides for determining, using fixed-functionality hardware logic (e.g., learning and/or modeling), when to refresh addresses for one or more memory cells in advance of receiving a request to access the one or more memory cells. Illustrated processing block 1308 provides for evaluating whether an address identified for access has been previously refreshed. Illustrated processing block 1310 provides for the MC issuing a command (e.g., read operation and/or write operation) to the DRAM, when the address identified for access has been previously refreshed. Illustrated processing block 1312 provides for the DRAM executing the command. Illustrated processing block 1314 provides for the MC to update the refresh address counter and/or accessed row address detector.

Non-limiting examples of non-volatile memory may include any or a combination of: solid state memory (such as planar or 3D NAND flash memory or NOR flash memory), 3D crosspoint memory, storage devices that use chalcogenide phase change material (e.g., chalcogenide glass), byte addressable non-volatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistorless stackable cross point architecture in which memory cells sit at the intersection of words lines and bit lines and are individually addressable and in which bit storage is based on a change in bulk resistance.

FIG. 14 is a block diagram 1400 of an example of a processor core 1401 according to one embodiment. The processor core 1401 may be the core for any type of processor, such as a micro-processor, an embedded processor, a digital signal processor (DSP), a network processor, or other device to execute code. Although only one processor core 1401 is illustrated in FIG. 14, a processing element may alternatively include more than one of the processor core 1401 illustrated in FIG. 14. The processor core 1401 may be a single-threaded core or, for at least one embodiment, the processor core 1401 may be multithreaded in that it may include more than one hardware thread context (or "logical processor") per core.

FIG. 14 also illustrates a memory 1407 coupled to the processor core 1401. The memory 1407 may be any of a wide variety of memories (including various layers of memory hierarchy) as are known or otherwise available to those of skill in the art. The memory 1471 may include one or more code 1413 instruction(s) to be executed by the processor core 1400, wherein the code 1413 may implement the method 400 (FIG. 4A), method 450 (FIG. 4B) and method 1300 (FIG. 13), already discussed. The memory 1471 may include, for example, volatile memory, non-volatile memory, and so on, or combinations thereof. For example, the memory 1471 may include dynamic random access memory (DRAM) configured as one or more memory modules such as, for example, dual inline memory modules (DIMMs), small outline DIMMs (SODIMMs), etc., read-only memory (ROM) (e.g., programmable read-only memory (PROM), erasable PROM (EPROM), electrically EPROM (EEPROM), etc.), phase change memory (PCM), and so on, or combinations thereof. The memory 1471 may include an array of memory cells arranged in rows and columns, partitioned into independently addressable storage locations. The processor core 1401 follows a program sequence of instructions indicated by the code 1413. The instructions may include a read instruction, a write instruction, an erase instruction, a move instruction, an arithmetic instruction, a control instruction, and so on, or combinations thereof. The instructions may move data (e.g., program data, operation code, operand, etc.) between a cache or a register (not shown) and the memory 1471 and/or the secondary memory storage, to read the data from the memory 1471, to write the data to the memory 1471, to perform an arithmetic operation using the data (e.g., add, subtract, bitwise operation, compare, etc.), to perform a control operation associated with the data (e.g., branch, etc.), and so on, or combinations thereof. The instructions may include any code representation such as, for example, binary code, octal code, and/or hexadecimal code (e.g., machine language), symbolic code (e.g., assembly language), decimal code, alphanumeric code, higher-level programming language code, and so on, or combinations thereof. Thus, for example, hexadecimal code may be used to represent an operation code (e.g., opcode) of an x86 instruction set including a byte value "00" for an add operation, a byte value "8B" for a move operation, a byte value "FF" for an increment/decrement operation, and so on. Each instruction may enter a front end portion 1410 and be processed by one or more decoders 1421. The decoder 1421 may generate as its output a micro operation such as a fixed width micro operation in a predefined format, or may generate other instructions, micro-instructions, or control signals which reflect the original code instruction. The illustrated front end portion 1411 also includes register renaming logic 1425 and scheduling logic 1431, which generally allocate resources and queue the operation corresponding to the convert instruction for execution.

The processor core 1401 is shown including execution logic 1451 having a set of execution units 1455-1 through 1455-N. Some embodiments may include a number of execution units dedicated to specific functions or sets of functions. Other embodiments may include only one execution unit or one execution unit that can perform a particular function. The illustrated execution logic 1451 performs the operations specified by code instructions.

After completion of execution of the operations specified by the code instructions, back end logic 1461 retires the instructions of the code 1413. In one embodiment, the processor core 1401 allows out of order execution but requires in order retirement of instructions. Retirement logic 1465 may take a variety of forms as known to those of skill in the art (e.g., re-order buffers or the like). In this manner, the processor core 1401 is transformed during execution of the code 1413, at least in terms of the output generated by the decoder, the hardware registers and tables utilized by the register renaming logic 1425, and any registers (not shown) modified by the execution logic 1451.

Although not illustrated in FIG. 14, a processing element may include other elements on chip with the processor core 1401. For example, a processing element may include memory control logic along with the processor core 1401. The processing element may include I/O control logic and/or may include I/O control logic integrated with memory control logic. The processing element may also include one or more caches.

Referring now to FIG. 15, shown is a block diagram of a computing system 1500 embodiment in accordance with an embodiment. Shown in FIG. 15 is a multiprocessor system 1500 that includes a first processing element 1570 and a second processing element 1580. While two processing elements 1570 and 1580 are shown, it is to be understood that an embodiment of the system 1500 may also include only one such processing element.

The system 1500 is illustrated as a point-to-point interconnect system, wherein the first processing element 1570 and the second processing element 1580 are coupled via a point-to-point interconnect 1550. It should be understood that any or all of the interconnects illustrated in FIG. 15 may be implemented as a multi-drop bus rather than point-to-point interconnect.

As shown in FIG. 15, each of processing elements 1570 and 1580 may be multicore processors, including first and second processor cores (i.e., processor cores 1574a and 1574b and processor cores 1584a and 1584b). Such cores 1574a, 1574b, 1584a, 1584b may be configured to execute instruction code in a manner similar to that discussed above in connection with FIG. 14.

Each processing element 1570, 1580 may include at least one shared cache 1598a, 1598b. The shared cache 1598a, 1598b may store data (e.g., instructions) that are utilized by one or more components of the processor, such as the cores 1574a, 1574b and 1584a, 1584b, respectively. For example, the shared cache 1598a, 1598b may locally cache data stored in a memory 1532, 1534 for faster access by components of the processor. In one or more embodiments, the shared cache 1598a, 1598b may include one or more mid-level caches, such as level 2 (L2), level 3 (L3), level 4 (L4), or other levels of cache, a last level cache (LLC), and/or combinations thereof.

While shown with only two processing elements 1570, 1580, it is to be understood that the scope of the embodiments are not so limited. In other embodiments, one or more additional processing elements may be present in a given processor. Alternatively, one or more of processing elements 1570, 1580 may be an element other than a processor, such as an accelerator or a field programmable gate array. For example, additional processing element(s) may include additional processors(s) that are the same as a first processor 1570, additional processor(s) that are heterogeneous or asymmetric to processor a first processor 1570, accelerators (such as, e.g., graphics accelerators or digital signal processing (DSP) units), field programmable gate arrays, or any other processing element. There can be a variety of differences between the processing elements 1570, 1580 in terms of a spectrum of metrics of merit including architectural, micro architectural, thermal, power consumption characteristics, and the like. These differences may effectively manifest themselves as asymmetry and heterogeneity amongst the processing elements 1570, 1580. For at least one embodiment, the various processing elements 1570, 1580 may reside in the same die package.

The first processing element 1570 may further include memory controller logic (MC) 1572 and point-to-point (P-P) interfaces 1576 and 1578. Similarly, the second processing element 1580 may include a MC 1582 and P-P interfaces 1586 and 1588. As shown in FIG. 7, MC's 1572 and 1582 couple the processors to respective memories, namely a memory 1532 and a memory 1534, which may be portions of main memory locally attached to the respective processors. While the MC 1572 and 1582 is illustrated as integrated into the processing elements 1570, 1580, for alternative embodiments the MC logic may be discrete logic outside the processing elements 1570, 1580 rather than integrated therein.

The first processing element 1570 and the second processing element 1580 may be coupled to an I/O subsystem 1590 via P-P interconnects 1576 1586, respectively. As shown in FIG. 7, the I/O subsystem 1590 includes P-P interfaces 1594 and 1598. Furthermore, I/O subsystem 1590 includes an interface 1592 to couple I/O subsystem 1590 with a high performance graphics engine 1538. In one embodiment, bus 1549 may be used to couple the graphics engine 1538 to the I/O subsystem 1590. Alternately, a point-to-point interconnect may couple these components.

In turn, I/O subsystem 1590 may be coupled to a first bus 1516 via an interface 1596. In one embodiment, the first bus 1516 may be a Peripheral Component Interconnect (PCI) bus, or a bus such as a PCI Express bus or another third generation I/O interconnect bus, although the scope of the embodiments are not so limited.

As shown in FIG. 15, various I/O devices 1514 (e.g., speakers, cameras, sensors) may be coupled to the first bus 1516, along with a bus bridge 1518 which may couple the first bus 1516 to a second bus 1520. In one embodiment, the second bus 1520 may be a low pin count (LPC) bus. Various devices may be coupled to the second bus 1520 including, for example, a keyboard/mouse 1512, communication device(s) 1526, and a data storage unit 1519 such as a disk drive or other mass storage device which may include code 1530, in one embodiment. The illustrated code 1530 may implement the method 400 (FIG. 4A), method 450 (FIG. 4B) and method 1300 (FIG. 13), already discussed, and may be similar to the code 1413 (FIG. 14), already discussed. Further, an audio I/O 1524 may be coupled to second bus 1520 and a battery 1510 may supply power to the computing system 1500.

Note that other embodiments are contemplated. For example, instead of the point-to-point architecture of FIG. 15, a system may implement a multi-drop bus or another such communication topology. Also, the elements of FIG. 15 may alternatively be partitioned using more or fewer integrated chips than shown in FIG. 15.

Additional Notes and Examples

Example 1 may include a dynamic random access memory (DRAM) apparatus comprising a DRAM comprising a memory bank comprising a plurality of memory cells, and a plurality of sense amplifiers associated with one or more of the memory cells to transfer sense amplifier data between the one or more of the memory cells, wherein each of the memory cells is identified by a row address identifying a word line and a column address identifying a bit line value pair, the bit line value pair including a first bit line value and a second bit line value, and a refresh address counter to calculate each address of the word lines of the memory bank based on the row address, wherein one or more targeted word lines are to be identified by the row address received by the DRAM to perform one or more memory operations on the one or more targeted word lines, and wherein non-targeted word lines identify word lines not identified for access by the one or more memory operations, a first transfer gate and a second transfer gate connected to each of a respective sense amplifier of the sense amplifiers, wherein the DRAM is to execute one or more commands, wherein the one or more commands are to include a hidden per-bank refresh command.

Example 2 may include the apparatus of Example 1, wherein the hidden per-bank refresh command is to cause the one or more targeted word lines to be activated for the read operation or the write operation to be subsequently executed, and simultaneously cause a hidden refresh operation to identify the address of the one or more non-targeted word lines to refresh, and wherein the hidden per-bank refresh command is to be issued once per memory bank to perform the hidden refresh operation for the one or more non-targeted word lines.

Example 3 may include the apparatus of Example 2, further comprising a third transfer gate and a fourth transfer gate for the respective sense amplifier, wherein the third transfer gate is connected to a first local input-output signal and the fourth transfer gate is connected to a second local input-output signal, wherein the first transfer gate is connected between the respective sense amplifier and the third transfer gate, and wherein the second transfer gate is connected between the respective sense amplifier and the fourth transfer gate connected.

Example 4 may include the apparatus of Example 2, wherein the first transfer gate is connected between the respective sense amplifier and the first bit line value and the second transfer gate is connected between the respective sense amplifier and the second bit line value.

Example 5 may include the apparatus of Example 4, wherein the memory bank is to issue a section selection signal to identify one or more of the word lines of the memory cells, and wherein each of the sense amplifiers is to be activated or deactivated by the section selection signal via one or more of the first transfer gate or the second transfer gate.

Example 6 may include the apparatus of Example 5, wherein the memory bank furthers comprises a column select line to identify the column address of one or more of the memory cells, wherein the third transfer gate and the fourth transfer gate are to be activated or deactivated by the column select line based on the column address.

Example 7 may include the apparatus of Example 2, wherein the DRAM is to receive the one or more commands for execution from a memory controller, wherein the one or more commands are to further include one or more of a read command, a write command, or an explicit per-bank refresh command, wherein the read command is to perform a read operation and the write command is to perform a write operation, and wherein the explicit per-bank refresh command is to refresh the word lines of the memory bank in an amount of time identified as refresh cycle time.

Example 8 may include the apparatus of Example 7, wherein the hidden per-bank refresh command is to be issued as an alternative to issuing the explicit per-bank refresh command in sequence with the read command or the write command.

Example 9 may include the apparatus of Example 8, wherein when the explicit per-bank refresh command is to be issued, the hidden per-bank refresh command, the read command and the write command cannot be executed until after the explicit per-bank refresh command refresh completes.

Example 10 may include a method of operating a dynamic random access memory (DRAM) comprising managing a DRAM comprising a memory bank that includes a plurality of memory cells, and a plurality of sense amplifiers associated with one or more of the memory cells to transfer sense amplifier data, receiving one or more commands for the DRAM to execute, transferring sense data, using the sense amplifiers, between the one or more of the memory cells based on the one or more commands, identifying each of the memory cells by a row address identifying a word line and a column address identifying a bit line value pair, the bit line value pair including a first bit line value and a second bit line value, and calculating, using a refresh address counter, each address of the word lines of the memory bank based on the row address, wherein one or more targeted word lines are to be identified by the row address received by the DRAM to perform one or more memory operations on the one or more targeted word lines, and wherein non-targeted word lines identify word lines not identified for access by the one or more memory operations, connecting, for each of a respective sense amplifier of the sense amplifiers, a first transfer gate and a second transfer gate to the respective sense amplifier, wherein the DRAM is to execute one or more commands, wherein the one or more commands are to include a hidden per-bank refresh command.

Example 11 may include the method of Example 10, wherein the hidden per-bank refresh command is to cause the one or more targeted word lines to be activated for the read operation or the write operation to be subsequently executed, and simultaneously cause a hidden refresh operation to identify the address of the one or more non-targeted word lines to refresh, and wherein the hidden per-bank refresh command is to be issued once per memory bank to perform the hidden refresh operation for the one or more non-targeted word lines.

Example 12 may include the method of Example 11, further comprising connecting a third transfer gate for the respective sense amplifier to a first local input-output signal, and connecting a fourth transfer gate for the respective sense amplifier to a second local input-output signal, wherein the first transfer gate is connected between the respective sense amplifier and the third transfer gate, and wherein the second transfer gate is connected between the respective sense amplifier and the fourth transfer gate connected.

Example 13 may include the method of Example 11, wherein the first transfer gate is connected between the respective sense amplifier and the first bit line value and the second transfer gate is connected between the respective sense amplifier and the second bit line value.

Example 14 may include the method of Example 13, further comprising identifying, using a section selection signal, one or more of the word lines of the memory cells, wherein each of the sense amplifiers is to be activated or deactivated by the section selection signal via one or more of the first transfer gate or the second transfer gate.

Example 15 may include the method of Example 14, further comprising identifying, using a column select line, the column address of one or more of the memory cells, wherein the third transfer gate and the fourth transfer gate are to be activated or deactivated by the column select line based on the column address.

Example 16 may include the method of Example 11, wherein the DRAM is to receive the one or more commands for execution from a memory controller, wherein the one or more commands are to further include one or more of a read command, a write command, or an explicit per-bank refresh command, wherein the read command is to perform a read operation and the write command is to perform a write operation, and wherein the explicit per-bank refresh command is to refresh the word lines of the memory bank in an amount of time identified as refresh cycle time.

Example 17 may include the method of Example 16, wherein the hidden per-bank refresh command is to be issued as an alternative to issuing the explicit per-bank refresh command in sequence with the read command or the write command, wherein when the explicit per-bank refresh command is to be issued, the hidden per-bank refresh command, the read command and the write command cannot be executed until after the explicit per-bank refresh command refresh completes.

Example 18 may include a dynamic random access memory (DRAM) system comprising a processor, a memory controller, a memory coupled to the processor and the memory controller, the memory including a DRAM comprising a memory bank comprising a memory bank that includes a plurality of memory cells, and a plurality of sense amplifiers associated with one or more of the memory cells to transfer sense amplifier data, wherein the sense amplifier is to transfer sense data to or from one or more of the memory cells based on one or more commands received by the DRAM, wherein each of the memory cells is identified by a row address identifying a word line and a column address identifying a bit line value pair, the bit line value pair including a first bit line value and a second bit line value, and a refresh address counter to calculate each address of the word lines of the memory bank based on the row address, wherein one or more targeted word lines are to be identified by the row address received by the DRAM to perform one or more memory operations on the one or more targeted word lines, and wherein non-targeted word lines identify word lines not identified for access by the one or more memory operations, a first transfer gate and a second transfer gate connected to each of a respective sense amplifier of the sense amplifiers, wherein the DRAM is to execute one or more commands, wherein the one or more commands are to include a hidden per-bank refresh command.

Example 19 may include the system of Example 18, wherein the hidden per-bank refresh command is to cause the one or more targeted word lines to be activated for the read operation or the write operation to be subsequently executed, and simultaneously cause a hidden refresh operation to identify the address of the one or more non-targeted word lines to refresh, and wherein the hidden per-bank refresh command is to be issued once per memory bank to perform the hidden refresh operation for the one or more non-targeted word lines.

Example 20 may include the system of Example 19, wherein the memory bank furthers comprises a third transfer gate and a fourth transfer gate for the respective sense amplifier, wherein the third transfer gate is connected to a first local input-output signal and the fourth transfer gate is connected to a second local input-output signal, wherein the first transfer gate is connected between the respective sense amplifier and the third transfer gate, and wherein the second transfer gate is connected between the respective sense amplifier and the fourth transfer gate connected.

Example 21 may include the system of Example 19, wherein the first transfer gate is connected between the respective sense amplifier and the first bit line value and the second transfer gate is connected between the respective sense amplifier and the second bit line value.

Example 22 may include the system of Example 21, wherein the memory bank furthers comprises a section selection signal to identify one or more of the word lines of the memory cells, and wherein each of the sense amplifiers is to be activated or deactivated by the section selection signal via one or more of the first transfer gate or the second transfer gate, wherein the memory bank furthers comprises a column select line to identify the column address of one or more of the memory cells, wherein the third transfer gate and the fourth transfer gate are to be activated or deactivated by the column select line based on the column address.

Example 23 may include the system of Example 19, wherein the DRAM is to receive the one or more commands for execution from the memory controller, wherein the one or more commands are to further include one or more of a read command, a write command, or an explicit per-bank refresh command, wherein the read command is to perform a read operation and the write command is to perform a write operation, and wherein the explicit per-bank refresh command is to refresh the word lines of the memory bank in an amount of time identified as refresh cycle time.

Example 24 may include the system of Example 23, wherein the hidden per-bank refresh command is to be issued as an alternative to issuing the explicit per-bank refresh command in sequence with the read command or the write command, wherein when the explicit per-bank refresh command is to be issued, the hidden per-bank refresh command, the read command and the write command cannot be executed until after the explicit per-bank refresh command refresh completes.

Example 25 may include the dynamic random access memory (DRAM) apparatus comprising means for performing the method of any one of Examples 10 to 17.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the computing system within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

I claim:

1. An apparatus comprising:
a dynamic random access memory (DRAM) comprising:
a memory bank comprising:
a plurality of memory cells, and
a plurality of sense amplifiers associated with one or more of the memory cells to transfer sense amplifier data between the one or more of the memory cells, wherein each of the memory cells is identified by a row address identifying a word line and a column address identifying a bit line value pair, the bit line value pair including a first bit line value and a second bit line value,
a refresh address counter to calculate each address of the word lines of the memory bank based on the row address, wherein one or more targeted word lines are to be identified by the row address received by the DRAM to perform one or more memory operations on the one or more targeted word lines, and wherein non-targeted word lines identify word lines not identified for access by the one or more memory operations, and
a first transfer gate and a second transfer gate connected to each of a respective sense amplifier of the sense amplifiers, wherein the DRAM is to execute one or more commands, wherein the one or more commands are to include a hidden per-bank refresh command.

2. The apparatus of claim 1, wherein the hidden per-bank refresh command is to cause the one or more targeted word lines to be activated for the read operation or the write operation to be subsequently executed, and simultaneously cause a hidden refresh operation to identify the address of the one or more non-targeted word lines to refresh, and wherein the hidden per-bank refresh command is to be issued once per memory bank to perform the hidden refresh operation for the one or more non-targeted word lines.

3. The apparatus of claim 2, further comprising:
a third transfer gate and a fourth transfer gate for the respective sense amplifier, wherein the third transfer gate is connected to a first local input-output signal and the fourth transfer gate is connected to a second local input-output signal, wherein the first transfer gate is connected between the respective sense amplifier and the third transfer gate, and wherein the second transfer gate is connected between the respective sense amplifier and the fourth transfer gate connected.

4. The apparatus of claim 2, wherein the first transfer gate is connected between the respective sense amplifier and the first bit line value and the second transfer gate is connected between the respective sense amplifier and the second bit line value.

5. The apparatus of claim 4, wherein the memory bank is to issue a section selection signal to identify one or more of the word lines of the memory cells, and wherein each of the sense amplifiers is to be activated or deactivated by the section selection signal via one or more of the first transfer gate or the second transfer gate.

6. The apparatus of claim 5, wherein the memory bank furthers comprises:
a column select line to identify the column address of one or more of the memory cells, wherein the third transfer gate and the fourth transfer gate are to be activated or deactivated by the column select line based on the column address.

7. The apparatus of claim 2,
wherein the DRAM is to receive the one or more commands for execution from a memory controller,
wherein the one or more commands are to further include one or more of a read command, a write command, or an explicit per-bank refresh command,
wherein the read command is to perform a read operation and the write command is to perform a write operation, and
wherein the explicit per-bank refresh command is to refresh the word lines of the memory bank in an amount of time identified as refresh cycle time.

8. The apparatus of claim 7, wherein the hidden per-bank refresh command is to be issued as an alternative to issuing the explicit per-bank refresh command in sequence with the read command or the write command.

9. The apparatus of claim 8, wherein when the explicit per-bank refresh command is to be issued, the hidden per-bank refresh command, the read command and the write command cannot be executed until after the explicit per-bank refresh command refresh completes.

10. A method comprising:
managing a dynamic random access memory (DRAM) comprising a memory bank that includes a plurality of memory cells, and a plurality of sense amplifiers associated with one or more of the memory cells to transfer sense amplifier data,
receiving one or more commands for the DRAM to execute,
transferring sense data, using the sense amplifiers, between the one or more of the memory cells based on the one or more commands,
identifying each of the memory cells by a row address identifying a word line and a column address identifying a bit line value pair, the bit line value pair including a first bit line value and a second bit line value,
calculating, using a refresh address counter, each address of the word lines of the memory bank based on the row address, wherein one or more targeted word lines are to be identified by the row address received by the DRAM to perform one or more memory operations on the one or more targeted word lines, and wherein non-targeted word lines identify word lines not identified for access by the one or more memory operations, and
connecting, for each of a respective sense amplifier of the sense amplifiers, a first transfer gate and a second transfer gate to the respective sense amplifier, wherein the DRAM is to execute one or more commands, wherein the one or more commands are to include a hidden per-bank refresh command.

11. The method of claim 10, wherein the hidden per-bank refresh command is to cause the one or more targeted word lines to be activated for the read operation or the write operation to be subsequently executed, and simultaneously cause a hidden refresh operation to identify the address of the one or more non-targeted word lines to refresh, and wherein the hidden per-bank refresh command is to be issued once per memory bank to perform the hidden refresh operation for the one or more non-targeted word lines.

12. The method of claim 11, further comprising:
connecting a third transfer gate for the respective sense amplifier to a first local input-output signal; and
connecting a fourth transfer gate for the respective sense amplifier to a second local input-output signal, wherein the first transfer gate is connected between the respective sense amplifier and the third transfer gate, and wherein the second transfer gate is connected between the respective sense amplifier and the fourth transfer gate connected.

13. The method of claim 11, wherein the first transfer gate is connected between the respective sense amplifier and the first bit line value and the second transfer gate is connected between the respective sense amplifier and the second bit line value.

14. The method of claim 13, further comprising identifying, using a section selection signal, one or more of the word lines of the memory cells,
wherein each of the sense amplifiers is to be activated or deactivated by the section selection signal via one or more of the first transfer gate or the second transfer gate.

15. The method of claim 14, further comprising:
identifying, using a column select line, the column address of one or more of the memory cells, wherein the third transfer gate and the fourth transfer gate are to be activated or deactivated by the column select line based on the column address.

16. The method of claim 11,
wherein the DRAM is to receive the one or more commands for execution from a memory controller,
wherein the one or more commands are to further include one or more of a read command, a write command, or an explicit per-bank refresh command,
wherein the read command is to perform a read operation and the write command is to perform a write operation, and
wherein the explicit per-bank refresh command is to refresh the word lines of the memory bank in an amount of time identified as refresh cycle time.

17. The method of claim 16,
wherein the hidden per-bank refresh command is to be issued as an alternative to issuing the explicit per-bank refresh command in sequence with the read command or the write command,
wherein when the explicit per-bank refresh command is to be issued, the hidden per-bank refresh command, the read command and the write command cannot be executed until after the explicit per-bank refresh command refresh completes.

18. A system comprising:
a processor;
a memory controller;
a memory coupled to the processor and the memory controller, the memory including a dynamic random access memory (DRAM) comprising:
a memory bank that includes a plurality of memory cells, and a plurality of sense amplifiers associated with one or more of the memory cells to transfer sense amplifier data, wherein the sense amplifier is to transfer sense data to or from one or more of the memory cells based on one or more commands received by the DRAM, wherein each of the memory cells is identified by a row address identifying a word line and a column address identifying a bit line value pair, the bit line value pair including a first bit line value and a second bit line value, a refresh address counter to calculate each address of the word lines of the memory bank based on the row address, wherein one or more targeted word lines are to be identified by the row address received by the DRAM to perform one or more memory operations on the one or more targeted word lines, and wherein non-targeted word lines identify word lines not identified for access by the one or more memory operations, and a first transfer gate and a second transfer gate connected to each of a respective sense amplifier of the sense amplifiers, wherein the DRAM is to execute one or more commands, wherein the one or more commands are to include a hidden per-bank refresh command.

19. The system of claim 18, wherein the hidden per-bank refresh command is to cause the one or more targeted word lines to be activated for the read operation or the write operation to be subsequently executed, and simultaneously cause a hidden refresh operation to identify the address of the one or more non-targeted word lines to refresh, and wherein the hidden per-bank refresh command is to be issued once per memory bank to perform the hidden refresh operation for the one or more non-targeted word lines.

20. The system of claim 19, wherein the memory bank furthers comprises:
a third transfer gate and a fourth transfer gate for the respective sense amplifier, wherein the third transfer gate is connected to a first local input-output signal and the fourth transfer gate is connected to a second local input-output signal, wherein the first transfer gate is connected between the respective sense amplifier and the third transfer gate, and wherein the second transfer gate is connected between the respective sense amplifier and the fourth transfer gate connected.

21. The system of claim 19, wherein the first transfer gate is connected between the respective sense amplifier and the first bit line value and the second transfer gate is connected between the respective sense amplifier and the second bit line value.

22. The system of claim 21, wherein the memory bank furthers comprises a section selection signal to identify one or more of the word lines of the memory cells, and wherein each of the sense amplifiers is to be activated or deactivated by the section selection signal via one or more of the first transfer gate or the second transfer gate.

23. The system of claim 22, wherein the memory bank furthers comprises:
a column select line to identify the column address of one or more of the memory cells, wherein the third transfer gate and the fourth transfer gate are to be activated or deactivated by the column select line based on the column address.

24. The system of claim 19,
wherein the DRAM is to receive the one or more commands for execution from the memory controller,
wherein the one or more commands are to further include one or more of a read command, a write command, or an explicit per-bank refresh command,
wherein the read command is to perform a read operation and the write command is to perform a write operation, and
wherein the explicit per-bank refresh command is to refresh the word lines of the memory bank in an amount of time identified as refresh cycle time.

25. The system of claim 24,
wherein the hidden per-bank refresh command is to be issued as an alternative to issuing the explicit per-bank refresh command in sequence with the read command or the write command,
wherein when the explicit per-bank refresh command is to be issued, the hidden per-bank refresh command, the read command and the write command cannot be executed until after the explicit per-bank refresh command refresh completes.

* * * * *